(12) United States Patent
Shih et al.

(10) Patent No.: US 7,211,825 B2
(45) Date of Patent: May 1, 2007

(54) INDIUM OXIDE-BASED THIN FILM TRANSISTORS AND CIRCUITS

(76) Inventors: Yi-Chi Shih, 2220 Thorley Pl., Palos Verdes Estates, CA (US) 90274; Cindy Xing Qiu, 6215 Bienville St., Brossard, Quebec (CA) J4Z 1W6; Ishiang Shih, 7905 Rue Rostand, Brossard, Quebec (CA) J4X 2R6; Chunong Qiu, 6215 Bienville St., Brossard, Quebec (CA) J4Z 1W6

( * ) Notice: Subject to any disclaimer, the term of this patent is extended or adjusted under 35 U.S.C. 154(b) by 60 days.

(21) Appl. No.: 10/866,267

(22) Filed: Jun. 14, 2004

(65) Prior Publication Data

US 2005/0275038 A1    Dec. 15, 2005

(51) Int. Cl.
H01L 29/04    (2006.01)
H01L 29/15    (2006.01)
H01L 29/10    (2006.01)
H01L 31/00    (2006.01)
H01L 31/036   (2006.01)

(52) U.S. Cl. .............................. 257/72; 257/13; 257/57; 257/59; 257/66

(58) Field of Classification Search ................ 257/13, 257/57, 59, 66, 72
See application file for complete search history.

(56) References Cited

U.S. PATENT DOCUMENTS

| | | | | |
|---|---|---|---|---|
| 5,827,760 A | * | 10/1998 | Seo ............................ | 438/161 |
| 5,883,396 A | * | 3/1999 | Reedy et al. ................. | 257/9 |
| 5,917,199 A | * | 6/1999 | Byun et al. ................... | 257/59 |
| 6,730,970 B1 | * | 5/2004 | Katoh et al. ................. | 257/365 |
| 6,836,299 B2 | * | 12/2004 | Chung et al. ................. | 349/42 |
| 2003/0063229 A1 | * | 4/2003 | Takahashi et al. ............ | 349/43 |
| 2003/0219530 A1 | * | 11/2003 | Yamazaki et al. ............ | 427/66 |
| 2004/0018797 A1 | * | 1/2004 | Murakami et al. ........... | 445/24 |
| 2004/0109110 A1 | * | 6/2004 | Kim et al. .................... | 349/106 |
| 2005/0017302 A1 | * | 1/2005 | Hoffman ...................... | 257/347 |
| 2005/0199959 A1 | * | 9/2005 | Chiang et al. ............... | 257/368 |
| 2005/0233170 A1 | * | 10/2005 | Yamazaki ..................... | 428/690 |

OTHER PUBLICATIONS

Jin Jang, Jai Ryuu, Soo Young Yoon and Jyung Ha Lee, "Low temperature polycrystalline silicon thin film transistors" Vacuum, vol. 51, No. 4, pp. 769-775, 1998.
S. Masuda, K. Kitamura, Y. Okumura, S. Miyatake, H. Tabata and T. Kawai, Transparent thin film transistors using ZnO as an active channel layer and their electrical properties, Journal of Applied Physics, vol. 93, No. 3, pp. 1624-1630, 2003.
R. L. Hoffman, B.J. Norris and J.F.Wager, "ZnO-based transparent thin-film transistors", Applied Physics Letters, vol. 82, No. 5, pp. 733-735, 2003.

* cited by examiner

*Primary Examiner*—Ida M. Soward

(57) ABSTRACT

In electronic displays or imaging units, the control of pixels is achieved by an array of transistors. These transistors are in a thin film form and arranged in a two-dimensional configuration to form switching circuits, driving circuits or even read-out circuits. In this invention, thin film transistors and circuits with indium oxide-based channel layers are provided. These thin film transistors and circuits may be fabricated at low temperatures on various substrates and with high charge carrier mobilities. In addition to conventional rigid substrates, the present thin film transistors and circuits are particularly suited for the fabrication on flexible and transparent substrates for electronic display and imaging applications. Methods for the fabrication of the thin film transistors with indium oxide-based channels are provided.

13 Claims, 10 Drawing Sheets

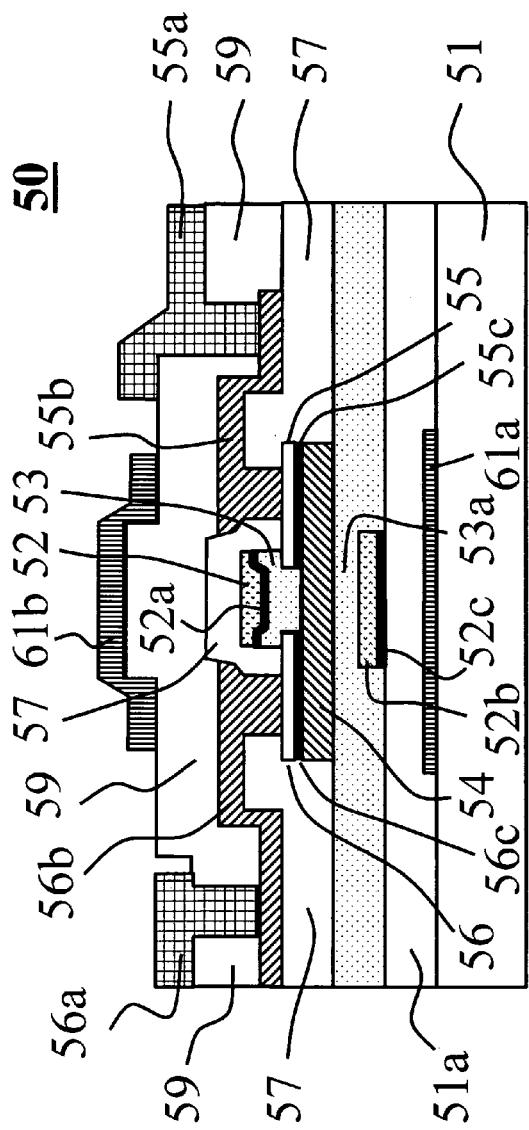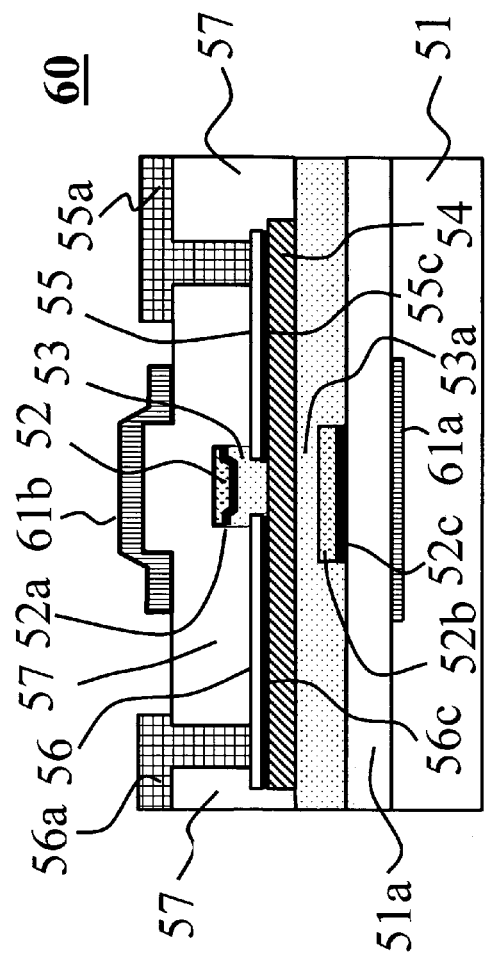
Fig. 6
Fig. 7

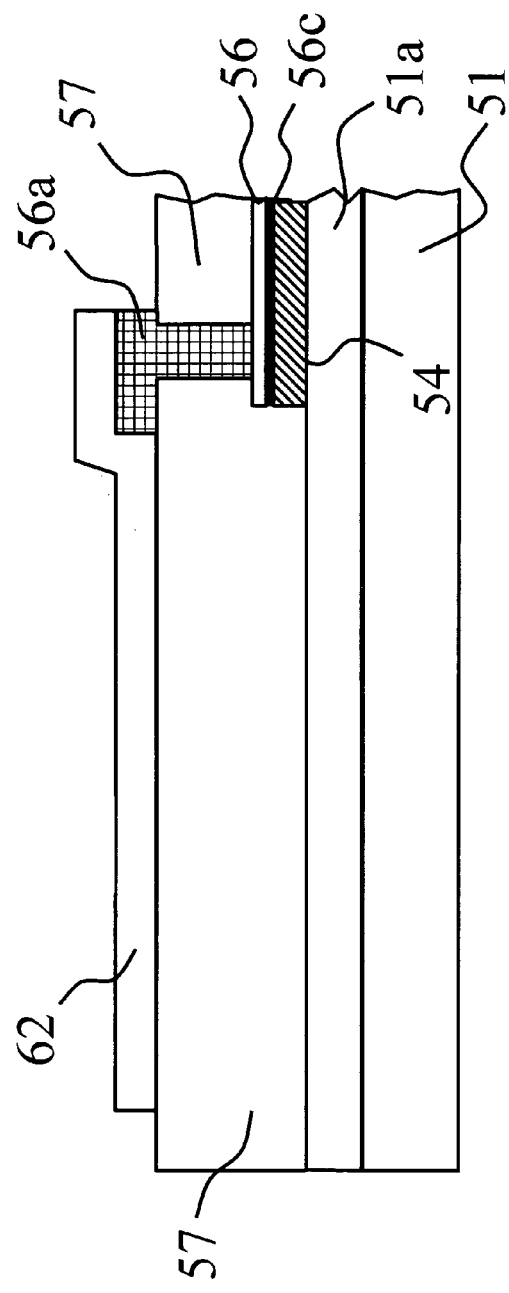
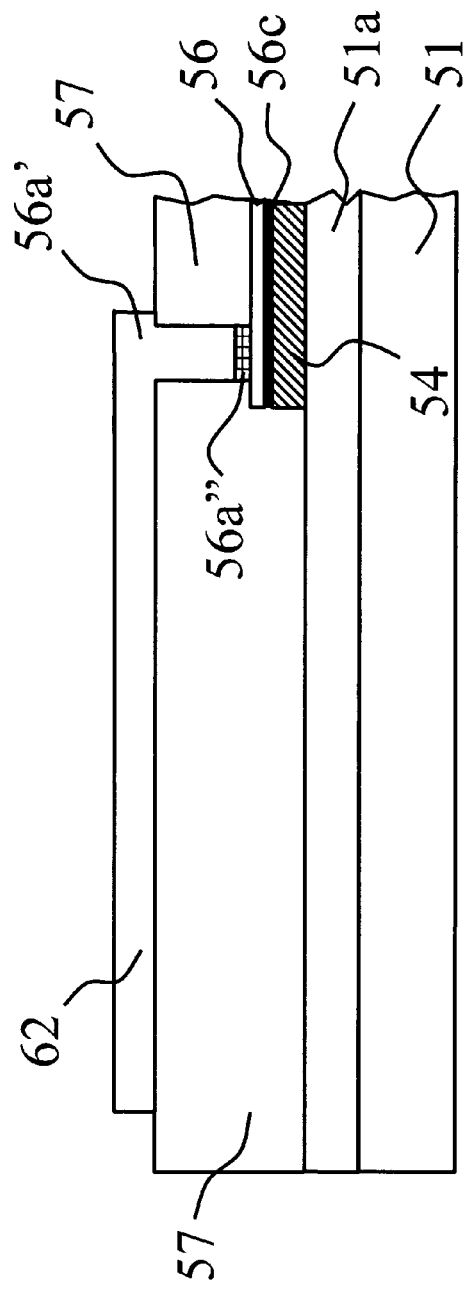
Fig. 8
Fig. 9

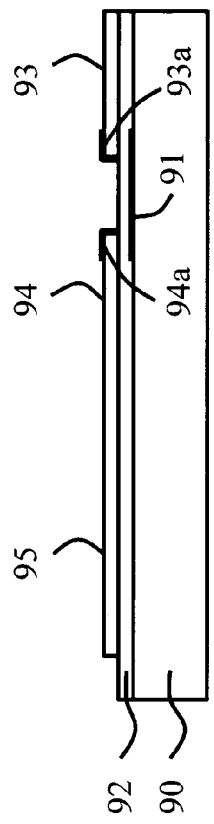
Fig. 10-a
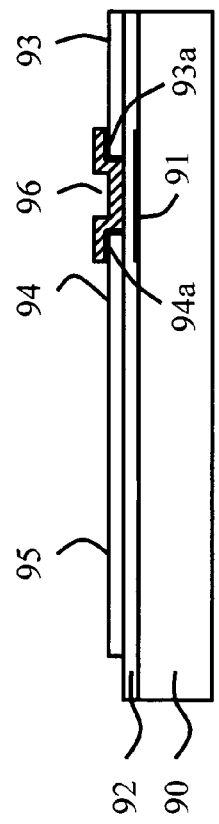
Fig. 10-b
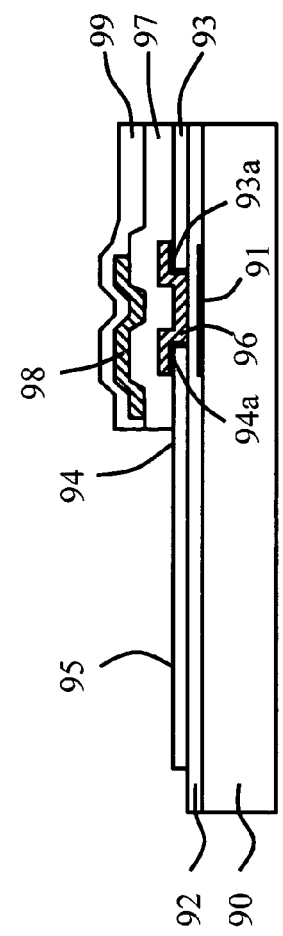
Fig. 10-c
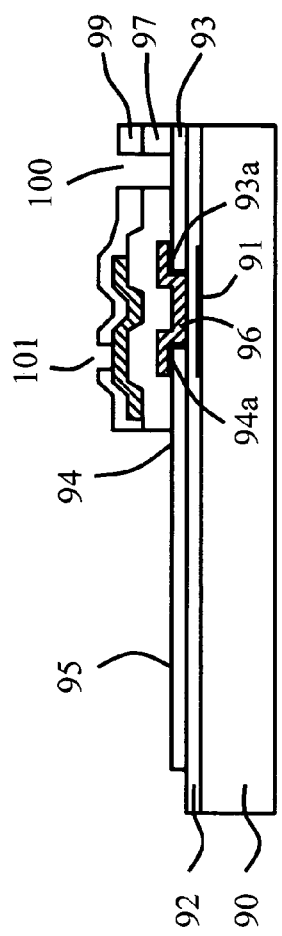
Fig. 10-d

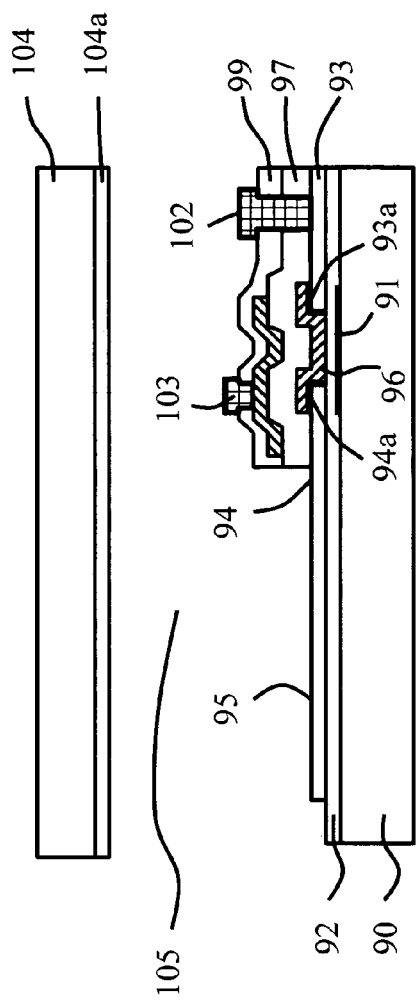
Fig. 10-e
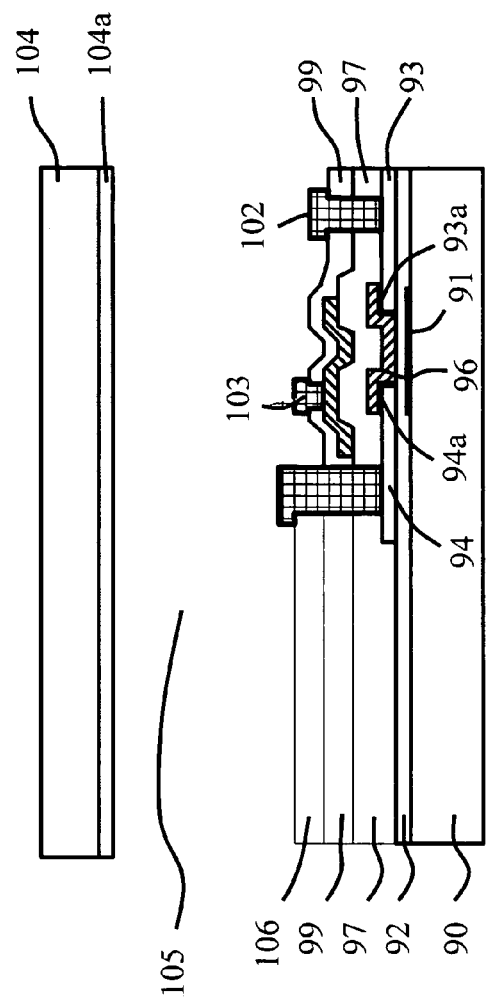
Fig. 10-f

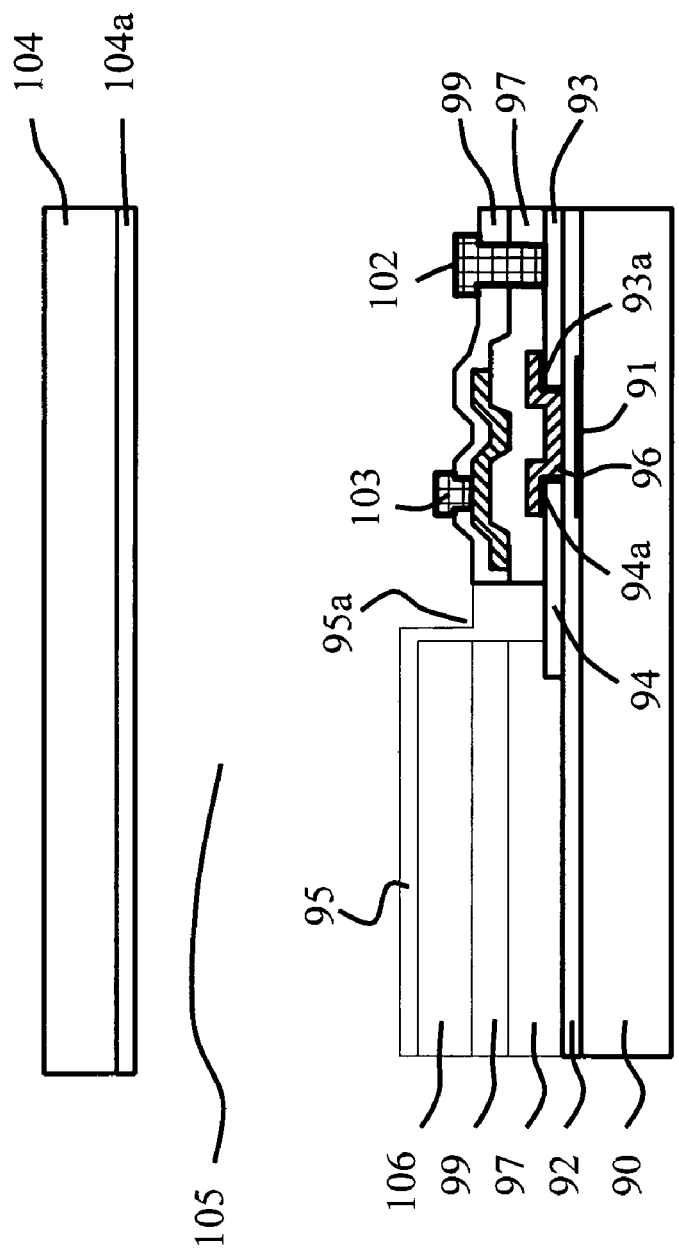
Fig. 10-g

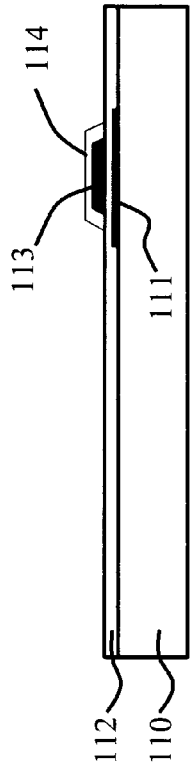
Fig. 11-a
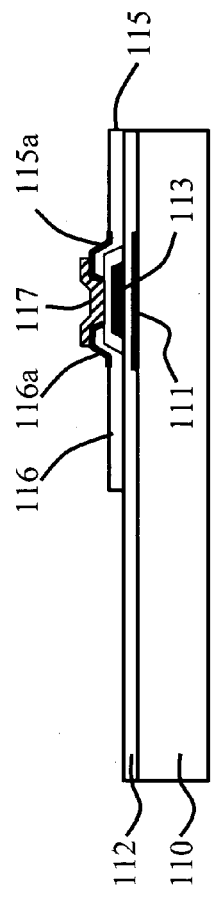
Fig. 11-b
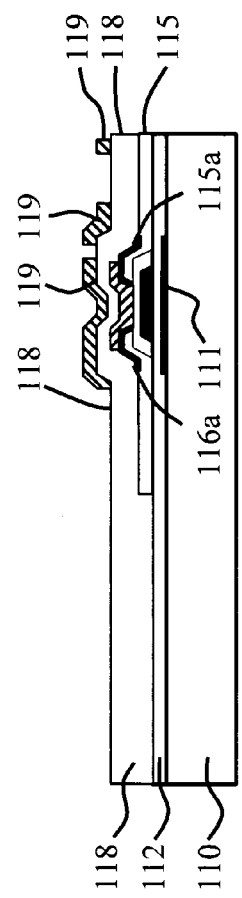
Fig. 11-c
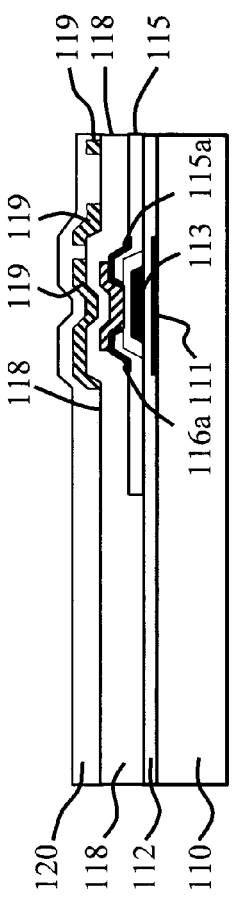
Fig. 11-d

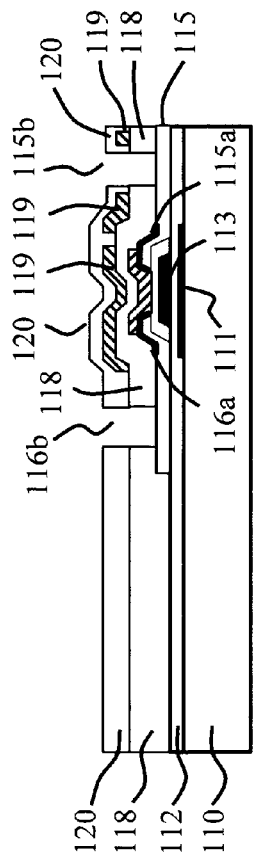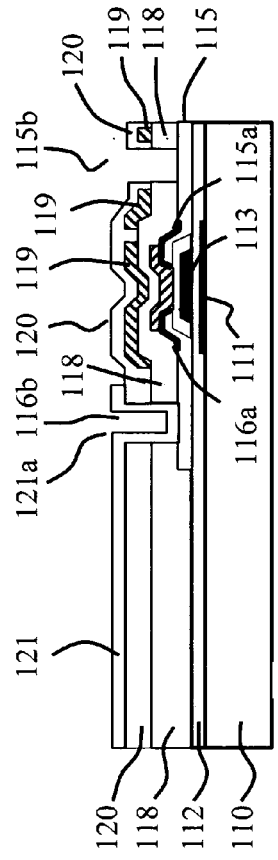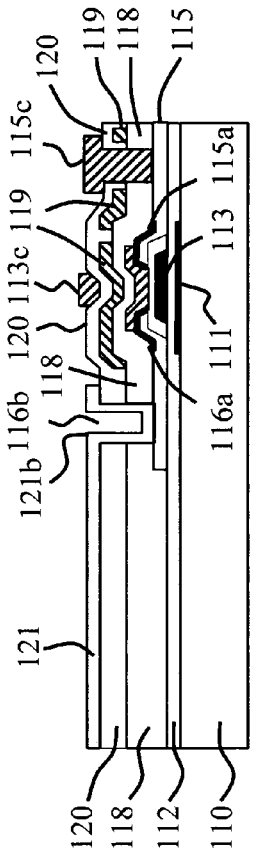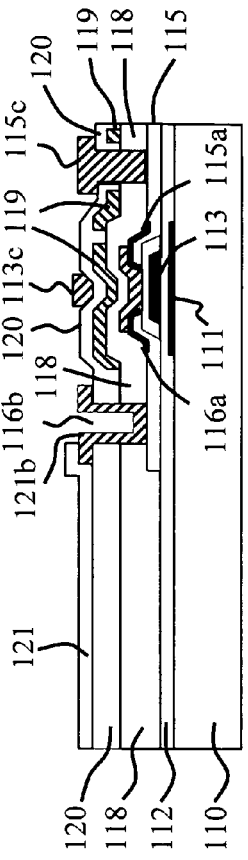
Fig. 11-e
Fig. 11-f
Fig. 11-g
Fig. 11-h

INDIUM OXIDE-BASED THIN FILM TRANSISTORS AND CIRCUITS

FIELD OF INVENTION

This invention relates to a family of indium oxide-based thin film transistors and a family of thin film transistor circuits for electronic signal, X-ray signal and optical signal processing and methods for fabricating the indium oxide-based thin film transistors and circuits.

BACKGROUND OF THE INVENTION

In circuits for electronic display and imaging applications, light emitting elements or light receiving elements are arranged either in one-dimensional or two-dimensional configurations to generate optical image patterns or to receive incident optical images. In order to generate image patterns, electrical signals from a circuit must be supplied to each light emitting element. In the case of electronic imaging units for receiving incident optical images, electrical signals from each light receiving element must be supplied to a circuit. FIG. 1 shows a simplified schematic diagram of a two-dimensional array (10). There are column electrical lines (11) each of which is connected to a column contact pad (12), and row electrical lines (13) each of them connected to a row contact pad (14). Area between two adjacent column electrical lines and two adjacent row electrical lines defines a pixel (15), which includes the region for a light emitting or light receiving element. For an electronic display, switching or emitting of light has to be done at a high speed so that the generated images are smooth and continuous to the viewers. Similarly, in an optical/X-ray scanner or imager, the switching or receiving of electrical signals has to be done at a high speed so that the received images will be smooth and continuous.

For most of the conventional electronic display products, the light switching elements are formed by liquid crystals (LC) with appropriate optical polarizers, color filters and a white light source as the backlight to form an array of light emitting elements. Other light emitting elements for the electronic display products include light emitting diodes (LED), inorganic or organic electroluminance devices (EL), and field emission devices (FED). To achieve effective switching of the light emitting elements or light switching elements, at least one thin film transistor (TFT) is constructed within the area for each pixel.

In FIG. 2, a portion of a LCD display panel (20) is shown where TFTs (21) are arranged in a two dimensional configuration on a bottom substrate (22) so that pixels in the same row can be addressed simultaneously by applying a voltage to a row electrical line (23) or gate line, which is connected to gates of all TFTs (21) in the same row. Whereas electrical signals to be supplied to or received from the pixels in the selected row are connected to or obtained from sources of these TFTs (21), through all of the column electrical lines (24) or data lines. When a TFT is selected with a gate voltage applied to the row electrical line (or gate line) (23), electrical signals can flow from the column electrical line (or data line) (24) through the source, channel, drain to a pixel electrode (25) of the light emitting element or light switching element connected, or vice versa. Here, it is noted that for simplicity not all of the elements required for a LCD are included in FIG. 2. From the above description, it becomes clear that the electrical lines supplying voltages to the gates of the TFTs (21) are often called gate lines (23). Whereas the electrical lines supplying signal voltages or currents to the pixels of light emitting or light switching elements or receiving voltages or currents from the pixels of light detecting elements are called data lines (24). A flat panel display also has a top substrate (26) to support other electrical and optical components which are not shown in FIG. 2 for simplicity. For the case of a LCD, liquid crystal is filled in the space (27) between the top substrate (26) and bottom substrate (22). A conducting and transparent top electrode (28) is deposited on the top substrate (26) facing the bottom substrate (22). In certain applications, all or part of the pixels in the flat panel array may be addressed at a time.

It should be mentioned that for displaying color images, each pixel has three sub-pixels, each for one of the principal colors: red, green and blue. In most of the conventional electronic flat panel displays, only the 2-D switching array is fabricated using TFT technology whereas standard silicon (Si) ICs are adopted as the row and column driving circuits. In order to minimize the number of electrical connections between the row and column driving circuits and the image display panel, it is desirable to form a row and a column driving circuits on the substrate where the pixels are located. In this manner, image signals can be fed in a serial manner from an external signal source to the row and column driving circuits on the display substrate for processing into substantially parallel signals for the control and switching of the pixels. In the above manner, the number of electrical connections between the external signal source or receiver circuit and the flat panel display can be reduced. To form these row and column driving circuits, a large number of TFTs are required.

In an electronic imaging unit, photovoltaic or photoconductive detectors are arranged in a two dimensional configuration as light receiving elements on a substrate to form an imaging array. When an optical image is incident onto the imaging array, electrical signals are generated by these light receiving elements. To allow a readout circuit to receive all of the electrical signals generated by the light receiving elements, TFTs are constructed in an array form with at least one TFT positioned and connected to a light receiving element. Each light receiving element and the associated TFT thus constitute a pixel in the imaging array of the electronic imaging unit. The TFTs are connected to a column and a row readout circuits so that electrical signals generated by the light receiving element due to the incident optical images can be acquired by the readout circuits for further signal processing or storage. The readout circuits may be preferably constructed on the same substrates by a group of TFTs.

As stated before, in most of the conventional electronic displays or electronic imaging units, silicon (Si) based TFTs are employed as the switching elements in the switching arrays and in certain cases the driving circuits or readout circuits. The Si technology for TFTs and circuits is based on the deposition of amorphous Si (α-Si) films or polycrystalline Si (p-Si) as the active channels for these TFTs. FIG. 3 illustrates a top view of a portion of a pixel (30) in a conventional flat panel display on a substrate (31). A data line (32) is connected to the source electrode (33) and a gate line (34) is connected to the gate electrode (35). There is a drain electrode (36) which is connected to a pixel electrode or light receiving element (37). An α-Si or p-Si channel layer (38) is deposited to overlap a portion of the source electrode (33) and a portion of the drain electrode (36) and is separated from the gate electrode (35) by a gate insulating dielectric. The source electrode (33), drain electrode (36), channel layer (38), gate electrode (35) and the insulating dielectric thus constitute a TFT on said substrate.

As mentioned before (see also FIG. 2), sources of the TFTs in a specific column of the array are connected together forming a (column) data line whereas gates of TFTs in a specific row of the array are connected together forming a (row) gate line. By applying a gate voltage to a specific row gate line and providing voltages to different data lines, specific pixels within the selected row gate line may be turned on to illuminate light or to switch on light switching elements. It is noted that TFTs in other rows of the flat display panel are not turned on so that light emitting or light switching elements in these other rows are not connected to the signals from the driving circuits. The above process may be repeated for the subsequent row gate lines in a sequential manner and with new sets of voltages applied each time for forming one frame of a complete image. To receive one frame of image in an electronic imaging unit, a gate voltage is applied to a specific row gate line and voltages (or currents) from different light receiving elements in this row are connected to and sensed by column amplifiers in readout circuits. It is noted that TFTs in other rows of the imaging array are not turned on so that light receiving elements in these other rows are not connected to the column amplifiers in the readout circuits. The light receiving process may be repeated in the electronic imaging array for the subsequent row gate lines to receive new sets of voltages for obtaining one frame of incident image. For LCD applications with a back light, a light shield (39, FIG. 3) is often applied in order to increase the contrast ratio. In this figure, a portion of the pixel electrode or light receiving element for an adjacent pixel designated as (37a) is also shown.

From the above description, it is clear that in an imaging array, the function of a pixel is opposite to the one for displays. The pixel in an imaging array consists of a device (called sensor or detector) which is sensitive to the radiation or light in an incident image to be detected. Radiation or light striking a pixel sensor will generate an electric signal with a magnitude proportional to the intensity of the radiation or light. When sensors or detectors are arranged in a two-dimensional array, the incident image striking this two-dimensional array may be retrieved electronically by having at least one TFT for each sensor or detector pixel and using a row read-out circuit and a column read-out circuit. Here, gates in all TFTs in one row of the two-dimensional array are connected together to form a row gate line whereas all sources in all TFTs in one column are connected to form a column data line. With the incident image illuminating the sensor or detector arrays and with a voltage supplied to a specific row gate line, the intensity of light in the incident image striking this row of sensor or detector array may be detected by measuring the voltage or current in each of the data lines. These voltage values will be stored in a processor and the above process is continued to a subsequent row of the sensor or detector array. By repeating the above process over the entire imaging array, storing the voltages or currents and displaying their values, the incoming image may be re-constructed. In the above imaging arrays, TFTs are often constructed using amorphous silicon ($\alpha$-Si) as the active channels.

For both the flat display panels and imaging arrays, parameters of the TFTs must be controlled and optimized in order to provide performance suitable for the display or imaging applications. Among the various parameters, the most important ones are the carrier mobility in the induced channel layers, the threshold voltage and switching speed. Values of the threshold voltage will affect the design of the row and column driving circuits whereas the switching speed affects the frame rates. The mobility value of the charge carriers in the induced channel determines the capability of the TFTs in conducting electrical currents when turned on. Hence, the higher the carrier mobility, the larger the electrical current at a given gate voltage and drain voltage, and the lower the unwanted joule heating in the induced channel. For TFTs with large charge carrier mobilities, the dimensions (length and width) the TFTs required to achieve a specific ON-state current are small and the area to be occupied by the TFTs in the pixels is also small. This will allow larger fraction of the light emitting areas or light receiving areas and hence the higher display brightness of imager sensitivity.

There is often a co-relation between the carrier mobility and switching speed. In general, the higher the mobility the higher the switching speed except for certain materials containing significant amounts of traps, resulting from defects. For pixels with a fixed area and fixed distance between the bottom electrode (22) and the top electrode (28) (see FIG. 2), the current capability of the TFTs in ON state must be large enough so that RC time constant is less than that required to achieve the required frame rates. Here, C is the pixel capacitance which is proportional to the pixel area and inversely proportional to the distance between the top and bottom electrodes. For LC or LED or EL devices, the distance between the top electrode and bottom electrode is kept as small as possible so that the required ON state voltages can be small. Whereas R is the resistance of each column data line, including the resistance of the source electrode, channel layer, and drain electrode, which is proportional to the length, inversely proportional to the cross-sectional area of the column data line and the electrodes and proportional to the resistivity. The resistance of the column data lines, source electrodes and drain electrodes are determined by the materials and deposition conditions used (resistivity about $10^{-6}$ ohm-cm for common metals), the length of the column data lines is determined by the dimensions of the displays and is typically in the order of several tens to several kilo ohms for a length of 12 inches. For TFTs with large carrier mobility in the channel layers, the drain current in the ON state will be larger at a given gate voltage and a drain voltage. Hence, the resistance between the drain and source of a TFT, which is in series with a corresponding column data line, is smaller. With a smaller total resistance, the RC time constant for a given pixel capacitance will be smaller, resulting in a faster switching of the pixel from ON state to OFF state or from OFF state to ON state.

Conventional electronic displays and imaging arrays are based on an $\alpha$-Si switching TFT array, CMOS column and row driving circuits or even readout circuits. The active channel layers of these TFTs are amorphous silicon ($\alpha$-Si) which is commonly deposited by a vacuum method on glass substrates. The field effect carrier mobility in $\alpha$-Si film deposited at low substrate temperatures (<200° C.) is quite low. It is noted that field effect mobility is the mobility of charge carriers under the influence of an electric field, applied through the gate insulator layer for the case of a TFT and substantially perpendicular to the direction of charge carrier motion. In order to obtain $\alpha$-Si TFTs of sufficient performance, the deposition of the $\alpha$-Si channel layers is often performed at substrate temperatures above 250° C. Typical TFTs in industrial display production based on $\alpha$-Si have a field effect mobility in the range of 0.4 to 0.7 $cm^2$/V-sec. Motivated by the need of high charge carrier field effect mobilities of the channel layers, various research work has been carried out and reported on the deposition of polycrystalline silicon (p-Si) as the channel layers for the TFTs. Although the mobility can be increased substantially (mobility values>100 cm$^2$/V-sec have been reported), the deposition of p-Si is often carried out at substrate temperatures higher than 450° C. It is possible to perform deposition of p-Si at a reduced temperature of about 300° C., however, the mobility will be significantly smaller, about 10 times less [Jin Jang, Jai Ryu, Soo Young Yoon and Jyung Ha Lee, "Low temperature polycrystalline silicon thin film transistors" Vacuum, volume 51, number 4, pages 769–775, 1998]. It is thus evident that TFTs based on Si channel layers required deposition substrate temperatures above 250° C. Although it is possible to deposit the Si-based channel layers at a substrate temperature below 200° C., the charge carrier mobility will be less than 0.4 cm$^2$/V-sec, at least for α-Si TFTs.

From the above comments, it is clear that it will be advantageous to develop new TFT materials or structures which can yield charge carrier field effect mobility greater than 1 cm$^2$/V-sec without the need of elevated substrate temperatures during the channel layer deposition. The low substrate temperatures may reduce the power consumption and processing time and allow the TFTs and circuits to be fabricated on substrates other than glass, such as flexible substrates having low glass transition temperatures.

Due to the relatively small energy gaps of α-Si or p-Si materials (between 1.1 eV and 1.8 eV), the channel layers of Si-based TFTs are rather sensitive to external illumination, due to optical absorption. Electron-hole pairs are generated upon optical absorption and these charge carriers drift along the channels layer when a drain voltage is applied. This current flows even without applying a voltage to the gate. Hence, proper light shields must be provided. Using large energy gap semiconductors (3.3 eV or greater) such as the indium oxide-based channel layers according to this invention, the TFTs fabricated are not as sensitive to room light. Therefore, the requirements for light shields will not be as severe as the conventional Si-based TFTs.

In various electronic displays and imaging applications, it is desirable to fabricate the switching arrays, driving circuits or readout circuits on flexible substrates, such as plastic sheets. The glass transition temperatures of plastic sheets currently available in industry are relatively low. There are plastic materials with high glass transition temperatures, however, these require special substrate preparation processes and the cost is usually high. During the deposition of α-Si or p-Si thin films for TFTs, the substrate temperatures are rather high (more than 250° C.) in order to obtain high charge carrier field effect mobility. At the elevated temperatures, most of the plastic substrates will deform or decompose, leading to severe degradation of the deposited thin films for TFTs and circuits.

There have been some reports on the development of TFTs with ZnO as the channel layers [Satoshi Masuda, Ken Kitamura, Yoshihiro Okumura, Shigehiro Miyatake, Hitoshi Tabata and Tomoji Kawai, "Transparent thin film transistors using ZnO as an active channel layer and their electrical properties, Journal of Applied Physics, volume 93, number 3, pages 1624–1630, 2003; R. L. Hoffman, B. J. Norris and J. F. Wager, "ZnO-based transparent thin-film transistors", Applied Physics Letters, volume 82, number 5, pages 733–735, 2003]. In such TFTs, the ZnO layers were deposited by vacuum deposition or spin coating. ZnO-based TFTs with mobility greater than 1 cm$^2$/V-sec at low substrate temperatures have been reported. However, these devices may not be stable thermally due to defects involved in ZnO thin films. Furthermore, these TFTs may not be chemically stable enough for circuit applications.

If thermally and chemically stable thin films of large energy gap semiconductors can be deposited at low substrate temperatures and with high enough charge carrier field effect mobilities, these thin films will find applications in TFT circuits for electronic displays, imaging arrays and various electronic systems requiring large area electronic circuits.

OBJECTIVES OF THE INVENTION

One object of this invention is to provide a TFT and a TFT circuit having indium oxide-based channel layers with a top gate structure. One other object is to provide a TFT and a TFT circuit utilizing indium oxide-based channel layers with a bottom gate structure. Another object is to provide an indium oxide-based TFT structure and a TFT circuit with the channel layer deposited at low substrate temperatures and having high charge carrier mobilities. Still another object is to provide an indium oxide-based TFT and circuit having transparent and conducting drain electrode and source electrode. Yet another object is to provide a TFT and circuit which are in-sensitive to room illumination. The other object is to provide a TFT and circuit on flexible plastic substrate. A final object of this invention is to provide methods for the fabrication of indium oxide-based TFTs and circuits.

BRIEF DESCRIPTION OF THE DRAWINGS

FIG. 6 shows a schematic cross-sectional view of an indium oxide-based TFT according to this invention with a top gate electrode configuration and with a second gate electrode.

FIG. 7 shows schematically a cross-section of an indium oxide-based TFT according to this invention with a top gate electrode configuration and without the intermediate electrodes.

FIG. 8 shows a schematic cross-section of a portion of an indium oxide-based TFT according to this invention illustrating the connection of the pixel electrode.

FIG. 9 shows a schematic cross-section of a portion of an indium oxide-based TFT according to this invention illustrating the connection of the pixel electrode.

FIG. 10 shows schematic cross-sectional views of an indium oxide-based TFT with a top gate electrode according to this invention after different stages of fabrication.

FIG. 11 shows schematic cross-sectional views of an indium oxide-based TFT with a bottom gate electrode according to this invention after different stages of fabrication.

DETAILED DESCRIPTION OF THE PREFERRED EMBODIMENTS

Indium oxide-based thin films have been developed over the last several decades as transparent and conducting oxide layers (TCO). Due to the large energy gaps (3.3–4.0 eV) and relatively large charge carrier mobilities, good thermal and chemical stabilities, the indium oxide-based thin films (notably indium tin oxide or commonly called ITO with an indium to tin ratio of 9:1) with very high electrical conductivities have been developed as the most important transparent and conducting oxide materials. These films have found various applications in electronic devices and circuits. In these devices and circuits, the ITO thin films deposited by various methods are used mainly as electrodes for conduction of electrical currents. For instance, ITO thin films are used as the bottom pixel electrodes and top electrodes in a liquid crystal display. From the above comments, it is clear that the material of ITO traditionally has been developed as transparent and conducting oxide layers (TCO) and was not employed as electric field controlled active channel layers for TFTs.

Figure 2:
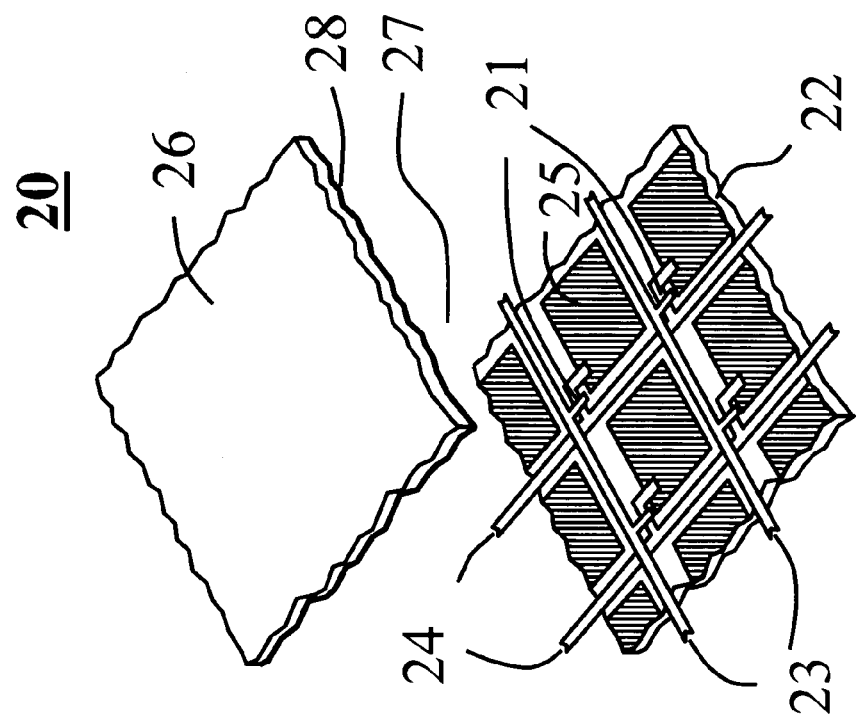
FIG. 2 shows a portion of a LCD flat display panel where TFTs are arranged in a two dimensional configuration to form a pixel array.
Figure 1:
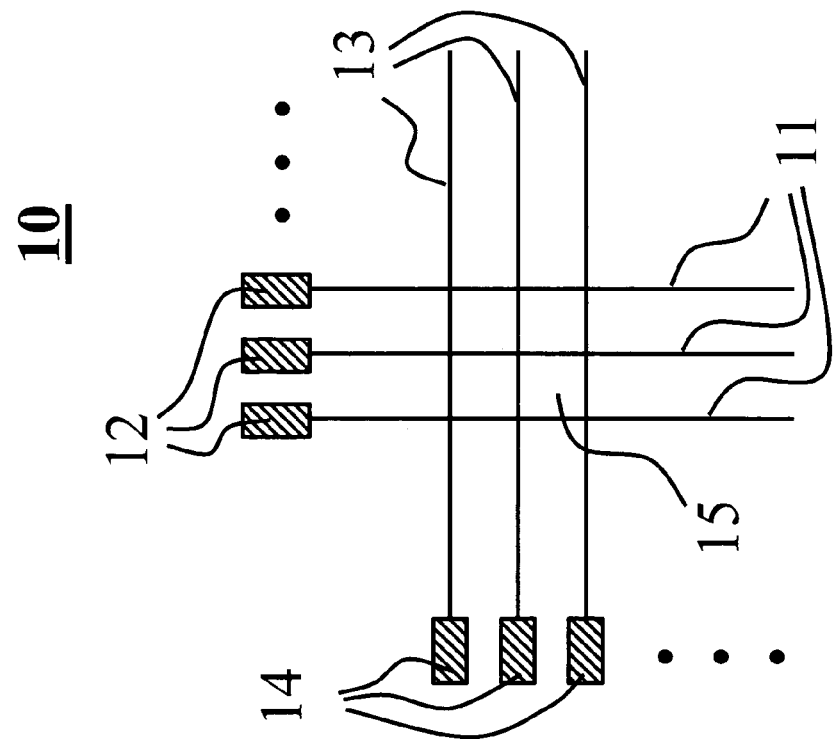
FIG. 1 shows a simplified schematic diagram of a two-dimensional display or imaging array.
Figure 3:
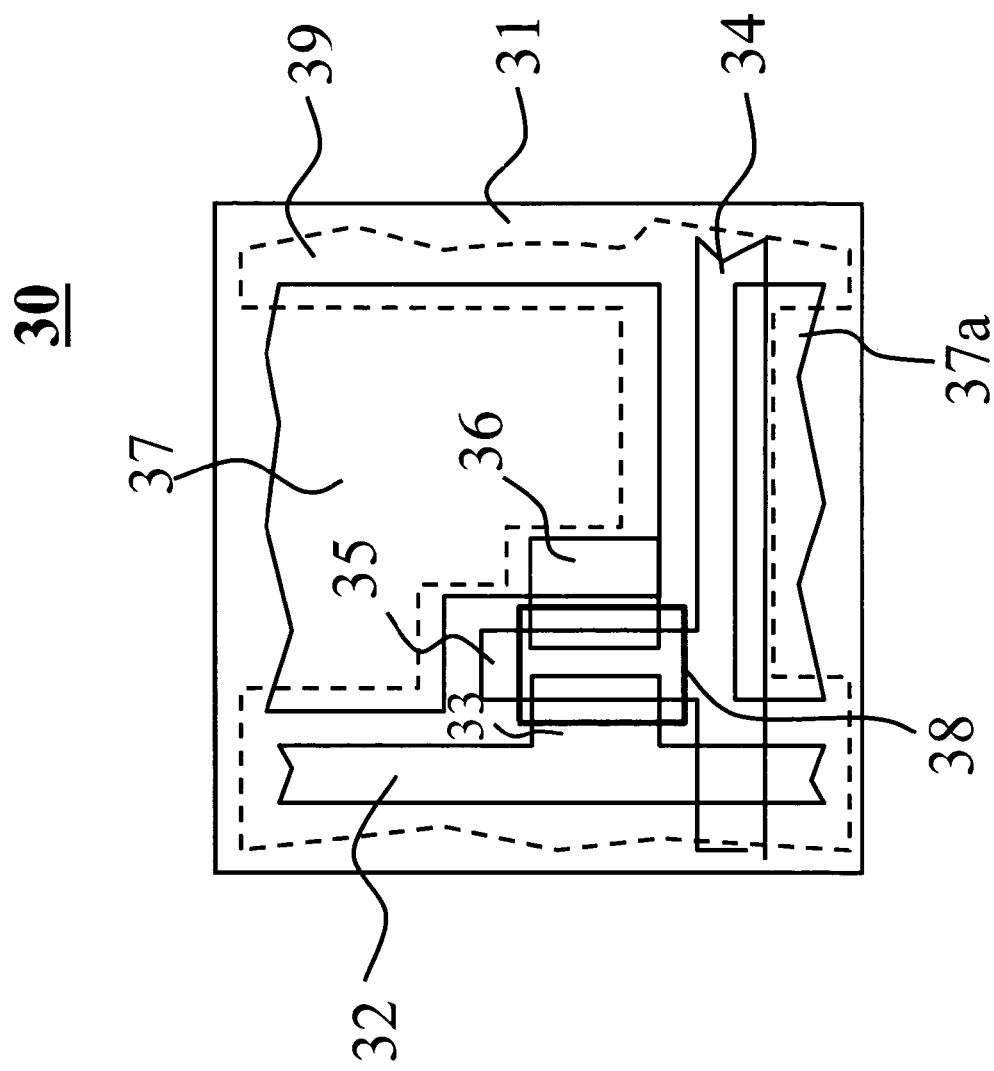
FIG. 3 illustrates a TFT and a portion of the pixel in a flat display panel or imaging unit.
Figure 4:
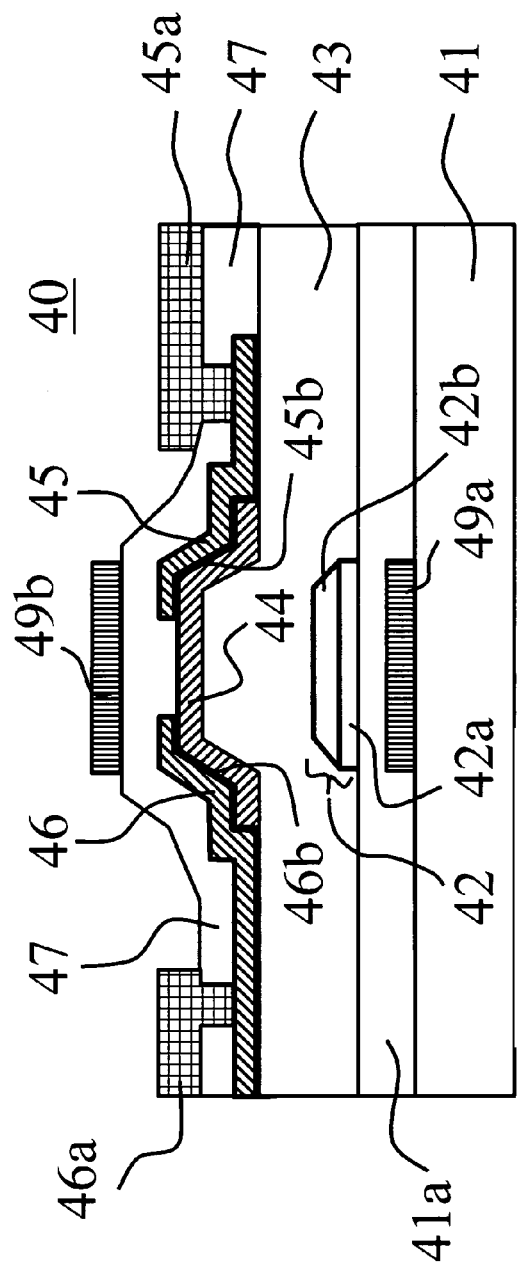
FIG. 4 shows a schematic cross-sectional view of an indium oxide-based TFT according to this invention with a bottom gate electrode configuration.

Bottom Gate TFT Structure:

In one embodiment of this invention, as shown in FIG. 4, a TFT (40) with an indium oxide-based channel layer for constructing switching arrays and circuits is provided. According to this invention, the material for the indium oxide-based channel layer may be selected from a group comprising: pure $In_2O_3$, alloys of $In_2O_3+Sn_2O_3$, $In_2O_3+Ga_2O_3$ and alloys of $In_2O_3+ZnO$. Materials of pure $In_2O_3$, alloys of $In_2O_3+Sn_2O_3$, $In_2O_3+Ga_2O_3$ and $In_2O_3+ZnO$ may be generally represented as $[In_xSn_{(1-x)}]_2O_3$, $[In_xGa_{(1-x)}]_2O_3$ and $[In_2O_3]_x[ZnO]_{1-x}$. Here, x represents the content of indium (In) in the alloys and may be selected in a range of $0 \leq x \leq 1$ according to the TFT requirements. It should be emphasized that certain impurities may be added to the indium-oxide-based channel layer to regulate further the electronic properties. The impurities include: N, P, Zn, Cd etc. Refer now to FIG. 4, where there is shown a cross-sectional view of indium oxide-based TFT (40) for constructing switching arrays and circuits according to this invention, said TFT (40) is fabricated on a first substrate (41) having a first gate electrode (42) preferably with two sub-layers (42a, 42b), a first gate insulator layer (43), an indium oxide-based channel layer (44), a first (source) electrode (45), a second (drain) electrode (46), a first interlayer dielectric layer (47), a first output electrode (45a) and a second output electrode (46a). It is noted that the indium oxide-based channel layer (44) may be fabricated in such a way that in contacting regions, it is on top of the first (source) electrode (45) and the second (drain) electrode (46). It is also noted that the first gate insulating layer (43) overlaps at least a portion of said first gate electrode (42), whereas the indium oxide-based channel layer (44) overlaps a portion of said first gate insulating layer (43) and at least a portion of said first (source) electrode (45) and at least a portion of said second (drain) electrode (46).

The electrical resistivity of the indium oxide-based channel is regulated during the fabrication of the present TFT so that it has sheet resistance in a range of $10^6$ ohms/square to $10^{10}$ ohms/square. Hence, the electrical resistance between the first (source) electrode (45) and the second (drain) electrode (46) will be high. Under such conditions, a dark current as small as 100 pA may be present when a drain voltage is applied between the first (source) electrode (45) and the second (drain) electrode (46). It is noted that the above dark current of 100 pA is an estimated value assuming that there is no potential barrier blocking effect between the first (source) electrode (45) and the indium oxide-based channel layer (44). When the work function of the first (source) electrode (45) is selected to give a blocking barrier, the actual dark current flowing through the indium oxide-based channel layer (44) will be substantially less compared to the one estimated above. With the small dark current, the TFT (40) is taken to be in an OFF state. When a voltage is applied between the first gate electrode (42) and the indium oxide-based channel (44), charges will be induced in this indium oxide-based channel (44) so that the electrical resistance between the first (source) electrode (45) and the second (drain) electrode (46) will be as small as $10^4$ ohms. When a drain voltage is applied between the first (source) electrode (45) and the second (drain) electrode (46), a current, as large as 500 µA, will flow. With the above large current, the TFT (40) is taken to be in an ON state. Hence, it becomes clear that the operation of the present indium oxide-based TFTs (40) is achieved by inducing charge carriers in the indium oxide-based channel layer (44).

It is noted that with certain modifications such as increasing the potential barrier height between the source and the channel layer, indium-oxide-based thin films with resistivity in a range of $10^2$–$10^8$ ohm-cm, more preferably $10^4$–$10^6$ ohm-cm, may be used. For a first electrode (45) and second electrode (46) having work functions substantially the same as or greater than the electronic affinity of the indium oxide-based channel layer (44), there is a large potential barrier between these electrodes and the channel layer in the OFF state. Negligible current will flow when a voltage is applied between the first output electrode (45a) and the second output electrode (46a). When a voltage is applied to the first gate electrode (42), a conducting channel is induced within the indium oxide-based channel layer (44) causing a lowering of the potential barrier between the first source electrode (45) and the channel layer. This results in electrical connection between the first output electrode (45a) and the second output electrode (46a). Hence, a large electrical current will flow when a voltage is applied between the first output electrode (45a) and the second output electrode (46a). It is thus clear that the electric field effects on the conduction of indium oxide-based layers are employed to regulate the resistance between the source and drain of the present TFTs.

According to the other embodiment of this invention, methods for the preparation of the indium oxide-based channel layer (44) for the present TFTs (40) and circuits include but not limited to: vacuum evaporation, vacuum sputtering, chemical vapor deposition, chemical bath deposition, pyrolysis, etc. In the above-mentioned methods, it is preferable to carry out the thin film deposition in environment containing oxygen so that the deposited indium oxide-based channel layers (44) will have sufficiently low equilibrium charge carrier concentration for the fabrication of TFTs and circuits with low leakage currents. In addition, it is preferable to apply a substrate heating to a temperature not too high to affect the substrates used (especially for the case of plastic substrates) but sufficient for the creation of indium oxide-based channel layers (44) with improved crystallinity and charge carrier mobilities. It is further noted that the oxygen content in the above-described deposition environment may vary with the substrate temperature values.

For the TFTs and circuits based on α-Si or p-Si, the substrates are mainly restricted to glass plates or similar materials having high softening or melting temperatures. This is because a high substrate temperature is required during the deposition of good quality α-Si and p-Si. Although it is possible to deposit α-Si TFTs on plastic substrates, the performance is degraded due to the decrease of temperatures required by the plastic substrates. According to another embodiment of this invention, the deposition of indium oxide-based channel layer (44) is performed at a low temperature, preferably below 150° C. In this manner, plastic substrates or sheets of several materials may be used as the substrates for the present TFTs and circuits. Possible plastic substrates include but not limited to PET, PEN, polyimide etc. The plastic substrates are light in weight, flexible and can be easily shaped to form displays or imaging arrays with different configurations. Hence, according to this invention, TFTs and circuits are constructed on flexible, transparent and light weight plastic substrates without exceeding the melting or deformation temperatures during the fabrication. When the fabrication of indium oxide-based TFTs and circuits are performed on glass substrates or metal substrates with a dielectric layer, substrates temperatures above 150° C. may be adopted in order to improve further the crystallinity and mobility values of the indium oxide-based channel layers (44).

For electronic display applications, it is preferable to select the first substrate (41) to be optically transparent. As mentioned before, the preferred substrate materials include, but not limited to, glass plates, plastic sheets and dielectric-layer-coated metal sheets. It should be pointed out that substrates of materials other than the ones described above may be employed. Some examples include stainless steel sheets and aluminum sheets with pre-coated dielectric layers. Examples of glass substrates are soda-limed glass plates, silica plates and quartz plates, as along as they are flat and smooth to allow for thin film deposition to be carried out. Examples of plastic substrates include polyethylene terephthalate (PET) sheets, polyethylene naphthalate (PEN) sheets, polycarbonate (PC), polyethersulfone (PES) polyimide (PI) etc., as long as they are smooth and with a glass transition temperature or softening temperature high enough to withstand the processing conditions (about 90° C.). For simplicity, all substrates fabricated using polymeric materials or organic materials are called plastic substrates in this invention. Thickness of the plastic substrates may range from tens of micrometers to millimeters. For the as-received plastic substrates, certain cleaning and treatment may be required prior to the deposition in order to remove greases and contaminants and to improve the surface smoothness. To remove the greases and other contaminants, a cleaning process in solvents such as trichloroethylene, acetone, de-ionized water or a cleaning process involving plasma may be carried out. After the cleaning, a short heat treatment may be performed in order to remove moisture and to smooth the surfaces. In order to minimize the un-wanted elemental inter-diffusion between the first substrate (41) and indium oxide-based channel (44), a thin substrate dielectric layer (41*a*) may be deposited on the substrate prior to the fabrication of the TFTs (40) and circuits. Although the energy gap of the indium oxide-based channel layer (44) is large, this layer is still sensitive to photons in the ultra-violet and blue light regions. Absorption of photons in the ultra-violet and blue light regions will lead to generation of electron hole pairs and cause a change in the dark channel resistance. Hence the OFF state current of the present TFTs (40) at a given drain voltage may increase substantially under the illumination of the ultra-violet or blue light. In addition, since the indium oxide-based channel layer (44) is deposited at relatively low substrate temperatures, certain traps may exist in the energy gap due the micro-crystallinity or defects. The occupation probability of these traps by electrons or holes may change under the illumination, again leading to a change in the OFF state resistance between the drain and the source. For a first gate electrode (42) having two sub-layers (42*a*, 42*b*), which is partially optically transparent, it is preferable to deposit a first light shield (49*a*) beneath the first gate electrode (42). In this case, the thin substrate dielectric layer (41*a*) has an additional function of providing electrical isolation between the first gate electrode (42) and the first light shield (49*a*). In addition, a second light shield (49*b*) is preferably deposited and patterned on the first interlayer dielectric layer (47) and over the indium oxide-based channel (44).

According to this invention for the indium oxide-based TFTs (40), the materials for the first light shield (49*a*) and the second light shield (49*b*) are selected from a group of materials preferably having large optical absorption coefficients in the ultra-violet and visible regions. These materials include but not limited to Al, Cu, Ni, Ti, Ta, W, Cr, Mo, alloys and their combinations.

To improve the adhesion of the first gate electrode (42), this first gate electrode (42) may consist of two sub-layers (42*a*, 42*b*). The first sub-layer (42*a*) contacting the thin substrate dielectric layer (41*a*) is selected from a group comprising: Ti, Cr, W, Ta, Mo, Ni and alloys, whereas the second sub-layer (42*b*) contacting the first gate insulating layer (43) is selected from a group comprising: Al, Al-alloys, Cu, Cu-alloys and any materials with sufficiently low electrical resistivity and high thermal stability.

Since the indium oxide-based channel layer (44) often has a relatively large work function, it is important to ensure a low resistance contact with the first (source) electrode (45) and the second (drain) electrode (46) when the indium oxide-based channel layer (44) is turned on. Furthermore, certain unwanted elemental inter-diffusion may take place between the indium oxide-based channel layer (44) and the first (source) electrode (45) and the second (drain) electrode (46), leading to degradation in the electronic properties of the indium oxide-based channel layer (44) or degradation in electrical conductivity of the first (source) electrode (45) and the second (drain) electrode (46). According to yet another embodiment of this invention, in order to avoid the above-mentioned drawbacks, a first contact layer (45*b*) is introduced between the first (source) electrode (45) and the indium oxide-based channel layer (44) whereas as a second contact layer (46*b*) is introduced between the second (drain) electrode (46) and the indium oxide-based channel layer (44). The materials of the first contact layer (45*b*) and the second contact layer (46*b*) may be selected from a group of materials comprising: Al, Cu, Ni, Ti, Ta, W, Cr, Mo, alloys and their combinations.

According to this invention, transparent and conducting ITO layers preferably with an indium/tin (In/Sn) ratio of 9/1 are employed as the source and drain electrodes (45, 46) for the present TFTs and circuits. Although metals such as Au, Al can be used as the first (source) and second (drain) electrodes (45, 46) for the TFTs, these may cause un-wanted effects due to the differences in work functions. If this occurs, additional processes or layers may be required. In order to simplify the fabrication and to improve the performance of the TFTs, indium oxide-based layers of low resistivity are advantageously used as the first (source) electrode (45) and the second (drain) electrode (46) in a TFT (40) in this invention. It has been well established that indium oxide-based thin film with resistivity as low as $10^{-4}$ ohm-cm can be prepared by vacuum deposition methods and chemical deposition methods. For the low resistivity indium oxide-based thin films, the Fermi level is very close to the conduction band edge whereas it is far away from the conduction band edge (or close to the middle of the band gap) for high resistivity channel layer (44). Hence, according to this invention, at the contact between the low resistivity indium oxide-based source and drain electrodes (45, 46) and the high resistivity channel layer (44), there is a large potential barrier (when the gate voltage is not applied) to block the flow of charge carriers from the source to the drain. In addition to the large potential barrier, the electrical resistivity of the channel layer is high causing a further reduction in the OFF state current. When a voltage is applied to the gate (42), charge carriers are induced in the channel layer (44) causing a decrease in the electrical resistivity and a shift of the channel layer Fermi level toward the conduction band edge. Hence, in addition to the decrease in the channel layer resistivity, the potential barrier between the first (source) electrode (45) and the indium oxide-based channel layer (44) is reduced by the application of the gate voltage. When a drain voltage is applied, a large drain current is allowed to flow and the indium oxide-based TFT (40) is in an ON state. For the present TFTs with low resistivity source and drain electrodes (45, 46) and a high resistivity channel layer (44), unwanted effects often seen in contacts of dissimilar materials are avoided and the ON/OFF ratio of the present TFTs can be as high as $10^7$ without the needs of complicated fabrication processes. Additional advantages of utilizing transparent and conducting ITO films as the source and drain electrodes (45, 46) are: [1] reduced inter-diffusion problem between the channel layer (44) and the source and drain electrodes (45, 46), [2] simplification of the fabrication processes and [3] reduction of the blockage of light in the source and drain regions.

For X-ray application, it is preferable to select the materials for the first light shield (49a) and the second light shield (49b) to be non-transmissive to X-rays. This characteristic of the materials is selected so that when illuminated by the X-ray, the electrical properties of the present indium oxide-based TFTs will not be affected by the X-ray.

In order to turn off effectively the indium oxide-based TFTs (40), it may be advantageous to add a second gate insulating layer and a second gate electrode to the structure in FIG. 4, forming a dual gate TFT structure. For simplicity of description, the second light shield (49b) may be configured and used as a second gate electrode whereas the thickness and material of the first interlayer dielectric layer (47) selected so that it serves as a second gate insulating layer. In this manner, control voltages may be connected to the first gate electrode (42) and the second gate electrode (49b) so that the electrical states of the indium oxide-based channel layer (44) can be modulated effectively. In other word, the TFTs (40) with the indium oxide-based channel layer (44) may be turned OFF or turned ON more effectively by having the dual gate structure. It should be mentioned that in this dual gate TFT structure, a second interlayer dielectric layer and a second light shield (not shown in FIG. 4) may be deposited and patterned in order to protect the TFTs and to prevent the generation of electrons and holes due to illumination of the indium oxide-based channel layer.

It is noted that the structure described above for the present indium oxide-based TFTs (40) and circuits has a bottom gate electrode where the channel layer is above the gate electrode.

To form a two dimensional array, the first gate electrodes (42) of all TFTs in one row are connected electrically together to form a gate line. This gate line may be of the same conductor materials as the first gate electrode (42) or may be another metal layer deposited on the thin substrate dielectric layer (41a) or directly on the first substrate (41). The electrical connection of the gate line associated with one row of TFTs to external circuits may be achieved by opening a window, which is not shown in FIG. 4 for simplicity, through the first interlayer dielectric layer (47) and the first gate insulating layer (43) and depositing a first gate contact electrode in this window. In the two dimensional array, the first (source) electrodes (45) of all TFTs in one column are connected electrically together to form a data line for supplying data in the form of voltages or currents. Hence, it becomes clear that a portion of the first output electrode (45a) is to serve as the data line. This data line may be the same conductor materials as the first output electrode (45a) or may be another metal layer and preferably deposited on said first interlayer dielectric layer (47).

Figure 5:
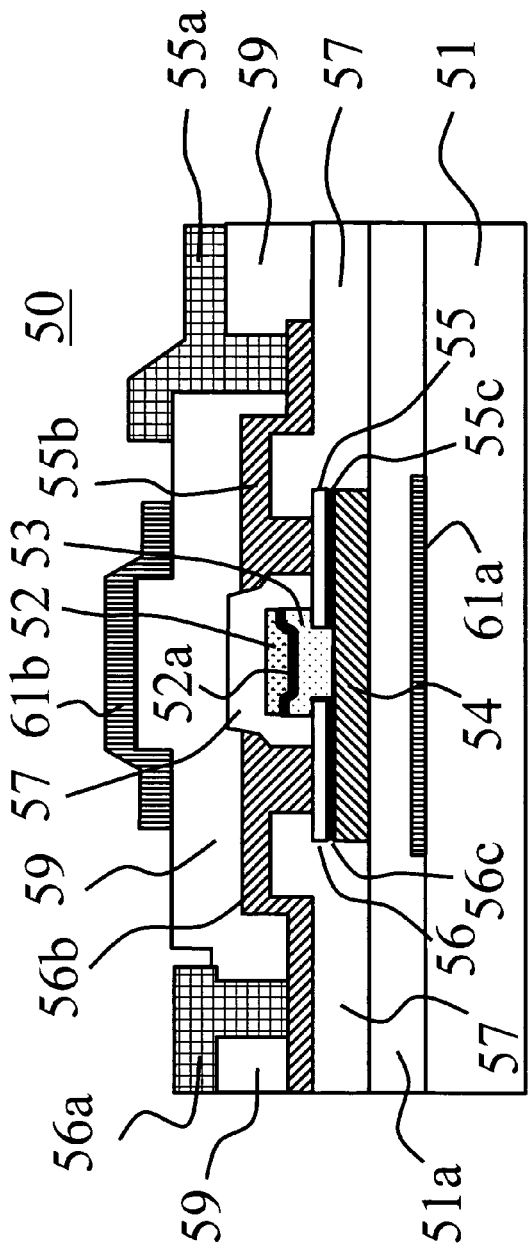
FIG. 5 shows schematically a cross-section of an indium oxide-based TFT according to this invention with a top gate electrode configuration and with intermediate electrodes.

Top Gate TFT Structure:

In another embodiment of this invention, as shown in FIG. 5, a TFT (50) with a top gate electrode is provided with an indium oxide-based channel layer. According to this invention, the indium oxide-based channel layer may be selected from a material group comprising: pure $In_2O_3$, alloys of $In_2O_3+Sn_2O_3$, $In_2O_3+Ga_2O_3$ and alloys of $In_2O_3+ZnO$. Materials of pure $In_2O_3$, alloys of $In_2O_3+Sn_2O_3$, $In_2O_3+Ga_2O_3$ and $In_2O_3+ZnO$ may be generally represented as $[In_xSn_{(1-x)}]_2O_3$, $[In_xGa_{(1-x)}]_2O_3$ and $[In_2O_3]_x[ZnO]_{1-x}$. Here, x represents the content of indium (In) in the alloys and may be selected in a range $0 \leq x \leq 1$ according to the TFT requirements. Refer now to FIG. 5, where there is shown a cross-sectional view of an indium oxide-based TFT (50) with a top gate electrode configuration according to this invention, said TFT (50) is fabricated on a first substrate (51) having a first gate electrode (52), a first gate insulator layer (53), an indium oxide-based channel (54), a first (source) electrode (55), a second (drain) electrode (56), a first intermediate electrode (55b), a second intermediate electrode (56b), a first interlayer dielectric layer (57), a first output electrode (55a) and a second output electrode (56a). According to yet another embodiment of this invention, said second output electrode (56a) is a portion of or is connected to a pixel electrode (see FIGS. 8 and 10). To facilitate the interconnection and planalization, a second interlayer dielectric layer (59) may be added with windows opened for electrical connections. It is also noted that the first gate insulator layer (53) overlaps at least a portion of said first gate electrode (52), whereas the indium oxide-based channel layer (54) overlaps a portion of said first gate insulating layer (53) and at least a portion of said first (source) electrode (55) and at least a portion of said second (drain) electrode (56).

For electronic display applications, it is preferable to select the first substrate (51) to be optically transparent. The preferred substrate materials include, but not limited to, glass plates, plastic sheets and dielectric-layer-coated metal sheets. In addition, substrates of materials other than the ones described above may be employed. Some examples include stainless steel sheets and aluminum sheets. Examples of glass substrates are soda-limed glass plates, silica plates and quartz plates, as along as they are flat and smooth to allow for thin film deposition of said first gate electrode (52), first gate insulator (53), first output electrode (55a), second output electrode (56a) and indium oxide-based channel (54). Examples of plastic substrates include polyethylene terephthalate (PET) sheets, polyethylene naphthalate (PEN) sheets, polycarbonate (PC), polyethersulfone (PES) polyimide (PI) etc., as long as they are smooth and with a glass transition temperature high enough to withstand the processing conditions (about 90° C.). Thickness of the plastic substrates may range from tens of micrometers to millimeters. It is noted that the structure described above for the present indium oxide-based TFTs and circuits has a top gate electrode where the channel layer (54) is below the gate electrode (52).

In order to minimize the un-wanted elemental interdiffusion between the substrate (51) and indium oxide-based channel (54), a thin substrate dielectric layer (51a) may be deposited on the substrate prior to the fabrication of the TFTs and circuits. For a first gate electrode (52) which is partially or completely optically transparent, it is preferable to deposit a first light shield (61a) beneath the indium oxide-based channel (54). In this case, the thin substrate dielectric layer (51a) has an additional function of providing electrical isolation between the indium oxide-based channel (54) and thee first light shield (61a). In addition, a second light shield (61b) is preferably deposited and patterned on the second interlayer dielectric layer (59) and over the indium oxide-based channel (54). According to this invention, the materials for the first light shield (61a) and the second light shield (61b) are selected from a group of materials preferably having large optical absorption coefficients in the ultra-violet and blue light region and/or the other visible region. These materials include but not limited to Al, Cu, Ni, Ti, Ta, W, Cr, Mo, alloys and their combinations. Although the energy gap of the indium oxide-based channel layer (54) is large, this layer is still sensitive to photons in the ultra-violet and blue light regions. Absorption of photons in the ultra-violet and blue light regions will lead to generation of electron hole pairs and cause a change in the dark channel resistance. Hence the OFF state current of the present TFTs (50) at a given drain voltage may increase substantially under the illumination of the ultra-violet or blue light. In addition, since the indium oxide-based channel layer (54) is deposited at relatively low substrate temperatures, certain traps may exist in the energy gap due the micro-crystallinity or defects. The occupation probability of these traps by electrons or holes may change under the illumination, again leading to a change in the OFF state resistance between the drain and source.

For X-ray application, it is preferable to select the materials for the first light shield (61a) and the second light shield (61b) to be non-transmissive to X-ray. This characteristic of the materials is selected so that when illuminated by the X-ray, the electrical properties of the present indium oxide-based TFTs (50) will not be affected by the X-ray.

As described before for the TFTs (40) with bottom gate electrodes shown in FIG. 4, with certain modifications indium-oxide-based thin films with a resistivity in a range of $10^2$–$10^8$ ohm-cm, more preferably $10^4$–$10^6$ ohm-cm may be used for the present TFTs (50) and circuits. These modifications include increasing the potential barrier height between the source and the channel layer in the OFF state. In this manner, negligible current will flow when a voltage is applied between these two output electrodes (55a, 56a) without the application of a gate voltage. When a voltage is applied to the first gate electrode (52), a conducting channel is induced within the indium oxide-based channel layer (54) and at the same time causing a lowering of the potential barrier between these electrodes and the channel layer. The above two effects result in electrical connection between the first output electrode (55a) and the second output electrode (56a).

To improve the adhesion of the first gate electrode (52), an intermediate first gate layer (52a) which contacts directly with the first gate insulating layer (53). The intermediate first gate layer (52a) contacting the first gate insulating layer (53) is selected from a group comprising: Ti, Cr, W, Ta, Mo, Ni and alloys, whereas the first gate layer (52) on the intermediate first gate layer (52a) is selected from a materials group comprising: Al, Al-alloys, Cu, Cu-alloys and any materials with sufficiently low electrical resistivity and good thermal stability.

Since the indium oxide-based channel layer (54) often has a relatively large work function, it is important to ensure to have low resistance contacts with the first (source) electrode (55) and the second (drain) electrode (56), especially when said indium oxide-based channel layer (54) is turned on by the application of a voltage to the first gate electrode (52). According to still another embodiment of this invention, it is preferable to have a large contact resistance between the indium oxide-based channel layer (54) and the first (source) electrode (55), and/or the second (drain) electrode (56) when the channel is not turned on so that the dark leakage current can be reduced.

According to this invention, methods for the preparation of the indium oxide-based channel layer (54) include but not limited to: vacuum evaporation, vacuum sputtering, chemical vapor deposition, chemical bath deposition, pyrolysis etc. During the above deposition, it is preferable to carry out the experiments in environment containing oxygen so that the deposited indium oxide-based films will have sufficiently low equilibrium charge carrier concentration for the fabrication of TFTs and circuits with low leakage currents. In addition, it is preferable to apply a substrate heating to a temperature not too high to affect the substrates used (especially for the case of plastic substrates) but sufficient for the creation of indium oxide-based channel layer (54) with improved crystallinity and charge carrier mobilities. It is further noted that the oxygen content in the above-described deposition environment may vary with the values of the substrate temperature.

In another embodiment of this invention, transparent and conducting ITO layers preferably with an indium/tin (In/Sn) ratio of 9/1 are employed as the source and drain contacts for the present TFTs and circuits with a top gate configuration. Although metals such as Au, Al can be used as the first (source) and second drain electrodes for the TFTs, these may cause un-wanted effects due to the differences in work functions. If this occurs, additional processes or layers may be required. In order to simplify the TFT fabrication and to improve the performance, according to another embodiment of this invention, indium oxide-based layers of low resistivity are advantageously used as the first (source) and the second (drain) electrodes in a TFT (50). It has been well established that indium oxide-based thin film with resistivity as low as $10^{-4}$ ohm-cm can be prepared by vacuum deposition methods and chemical deposition methods. For the low resistivity indium oxide-based thin films, the Fermi level is very close to the conduction band edge whereas it is far away from the conduction band edge (or close to the middle of the band gap) for high resistivity channel layer. Hence, according to an embodiment of this invention, at the contact between the low resistivity indium oxide-based source and drain electrodes and the high resistivity channel layer (54), there is a large potential barrier (when the gate voltage is not applied) to block the flow of charge carriers from the source to the drain. In addition to the large potential barrier, the electrical resistivity of the channel layer (54) is high causing a further reduction in the OFF state current. When a voltage is applied to the gate (52), charge carriers are induced in the channel layer (54) causing a decrease in the electrical resistivity and at the same time a shift of the channel layer Fermi level toward the conduction band edge. Hence, in addition to the decrease in the channel layer resistivity, the potential barrier height is reduced by the application of the gate voltage. When a drain voltage is applied, a large drain current is allowed to flow and the indium oxide-based TFT (50) is in an ON state. For the present TFTs with low resistivity source and drain electrodes and a high resistivity channel layer, unwanted effects often seen in contacts of dissimilar materials are avoided and the ON/OFF ratio of the present TFTs can be as high as $10^7$ without the needs of complicated fabrication processes. Additional advantages of utilizing transparent and conducting ITO as the source and drain electrodes are: [1] reduced inter-diffusion problem between channel layer and the source and drain, [2] simplification of the fabrication processes, and [3] reduction of the blockage of light in the source and drain regions.

Certain unwanted elemental inter-diffusion may take place, both during the TFT and circuit fabrication and after the fabrication, between the indium oxide-based channel layer (54) and the first (source) electrode (55) and the second (drain) electrode (56), leading to degradation in the electronic properties of the indium oxide-based channel layer (54) or degradation in electrical conductivity of the first (source) electrode (55) and the second (drain) electrode (56). According to another embodiment of this invention in order to avoid the afore-mentioned drawbacks, a first contact layer (55*c*) is introduced between the first (source) electrode (55) and the indium oxide-based channel layer (54) whereas a second contact layer (56*c*) is introduced between the second (drain) electrode (56) and the indium oxide-based channel layer (54). The first interlayer dielectric layer (57), a first intermediate electrode (55*b*), a second intermediate electrode (56*b*) are then constructed. The first contact layer (55*c*) and the second contact layer (56*c*) may be selected from a group comprising: Ti, Cr, W, Ta, Mo, Ni, alloys and combinations. For electronic display applications, it is preferable to select the first substrate (51) to be optically transparent.

To form a two dimensional array, the first gate electrodes (52) of all TFTs (50) in one row are connected electrically together to form a gate line. This gate line may be of the same conductor materials as the first gate electrode (52) or may be another metal layer deposited on said thin substrate dielectric layer (51*a*) or directly on said first substrate (51). The electrical connection of the gate line associated with one row of TFTs to external circuits may be achieved by opening a window, which is not shown in FIG. 5 for simplicity, through the first interlayer dielectric layer (57) and the second interlayer dielectric layer (59) and depositing a first gate contact electrode in this window. For the two dimensional array, the first (source) electrodes (55) of all TFTs in one column are connected electrically together to form a data line for supplying data in the form of voltages or currents. Hence, it becomes clear that a portion of the first output electrode (55*a*) is to serve as the data line. This data line may be the of same conductor materials as the first output electrode (55*a*) or may be another metal layer and preferably deposited on said second interlayer dielectric layer (59).

In order to modulate the indium oxide-based channel layer (54) more effectively in the present TFTs (50), a second gate electrode (52*b*) may be added to the TFT structure with a top gate configuration as shown in FIG. 6. It is noted that this second gate electrode (52*b*) is an optional to the present TFTs (50). This second gate electrode (52*b*) is deposited and patterned on the thin substrate dielectric layer (51*a*). Materials for the second gate electrode (52*b*) may be the same as that for the first gate electrode (52) and are selected from a group comprising: Al, Al-alloys, Cu, Cu-alloys and any materials with sufficiently low electrical resistivity and good thermal stability. Between the second gate electrode (52*b*) and the indium oxide-based channel layer (54), there is a second gate insulating layer (53*a*), said second gate insulating layer (53*a*) being selected from a group comprising: silicon oxide, silicon nitride, oxynitride and their combinations. Thickness of the second gate insulating layer (53*a*) is selected to be substantially the same as the first gate insulating layer (53). With the addition of the second gate electrodes (52*b*), the TFTs (50) may be turned OFF or turned ON more effectively.

In order to improve adhesion between the second gate layer (52*b*) and the thin substrate layer (51*a*), an intermediate second gate layer (52*c*) contacting the thin substrate layer (51*a*) may be deposited. Materials of said intermediate second gate layer (52*c*) may be selected from a group comprising: Ti, Cr, W, Ta, Mo, Ni, alloys and their combinations.

It is noted that the structure described above for the present indium oxide-based TFTs and circuits has a top gate electrode where the channel layer is below the gate electrode.

Simplified Top Gate TFT Structure:

To simplify the fabrication, the first intermediate electrode (55*b*) and the second intermediate electrode (56*b*) for the present indium oxide-based TFT (50) with a top gate as shown in FIG. 5 or FIG. 6 may be eliminated from the present TFT structure to give a simplified TFT structure (60) as shown in FIG. 7.

Here it is noted that the first (source) electrode (55) contacts the first output electrode (55*a*) whereas the second (drain) electrode (56) contacts the second output electrode (56*a*). Hence, the process steps required for the creation of the first intermediate electrode (55*b*) and the second intermediate electrode (56*b*) of the TFT (50) depicted in FIG. 5 or FIG. 6 can be eliminated. The above-described simplified TFT structure (60) will allow indium oxide-based TFTs with reduced contact resistances to both sources and drains to be fabricated. It is noted that all other items in FIG. 7 indicated by the numerals have the same definition and meanings as the ones shown in FIG. 5 and FIG. 6 and a description will not be repeated here.

According to yet another embodiment of this invention, as shown in FIG. 8, there is a pixel electrode (62) fabricated on the first interlayer dielectric layer (57) which is deposited on the first substrate (51) having a thin substrate dielectric layer (51*a*) for each indium oxide-based TFT, said pixel electrode (62) being connected electrically to the second (drain) electrode (56) through the second output electrode (56*a*), which makes electrical contact to the indium oxide-based channel layer (54) preferably through the second contact layer (56*c*). For applications in LCD, EL or OLED, this pixel electrode (62) is selected from a group of optically transparent and electrically conducting layers such as indium tin oxide, indium oxide, zinc oxide or their mixtures. In this manner, electrical voltages supplied to the first (source) electrode (55, FIGS. 5, 6 and 7) can be connected to the pixel electrode (62) for switching of liquid crystal applied thereon or actuating a EL or OLED light emitting element connected to it.

To simply further the structure for the present TFT with the indium oxide-based channel layer, the second output electrode (56*a*) shown in FIG. 8 may be replaced by a portion of the pixel electrode (62) which is electrically conducting (see FIG. 9). Here, it is noted that a contact portion (56a') of the pixel electrode (62) on a first interlayer dielectric layer (57) has made electrical contact to the second (drain) electrode (56). Said first interlayer dielectric layer is deposited on the first substrate (51) having a thin substrate dielectric layer (51a). There is a second contact layer (56c) between the indium oxide-based channel layer (54) and said second (drain) electrode (56). Since the electrical conductivity of the pixel electrode (62) may not be as high as metal materials such as Al, Au and Cu, it is desirable to design the dimensions of the contact portion (56a') so that the series resistance is small, preferably less than 10 ohms. To reduce the contact resistance, a thin layer of local second contact layer (56a") may be deposited between the contact portion (56a') and the second (drain) electrode (56). Said local second contact layer (56a") may be a material selected from a group comprising: metals of Ti, W, Ta, Cr, Mo or alloys.

According to yet another embodiment of this invention, the structure of TFTs with the indium oxide-based channel layer can be further simplified by employing a portion of the pixel electrode (62) to serve as the second (drain) electrode (56), to make direct electrical contact with the drain end of the indium oxide-based channel layer (54) and to define a separate layer during the formation of the pixel electrode (62) and let this separate layer to make electrical contact to the source end of the indium oxide-based channel layer (54). This will simplify the fabrication steps for the present indium oxide-based TFTs and circuits. The structure for this simplified TFT will become clear in FIG. 10-a through 10-g which illustrates the main steps for the fabrication of one of the TFT structures with the indium oxide-based channel layer for circuits according to this invention.

According to this invention, methods for the preparation of the indium oxide-based channel layer (54) include but not limited to: vacuum evaporation, vacuum sputtering, chemical vapor deposition, chemical bath deposition, pyrolysis etc. During the above deposition, it is preferable to carry out the experiments in environment containing oxygen so that the deposited indium oxide-based films will have sufficiently low equilibrium charge carrier concentration for the fabrication of TFTs and circuits with low leakage currents. In addition, it is preferable to apply a substrate heating to a temperature not too high to affect the substrates used (especially for the case of plastic substrates) but sufficient for the creation of indium oxide-based channel layer with improved crystallinity and charge carrier mobilities. It is further noted that the oxygen content in the above-described deposition environment may vary with the values of the substrate temperature.

The following fabrication flows provide the main steps for the creation of the indium oxide-based TFTs and circuits according to this invention. It is noted that variations can be easily derived by those skilled to the arts to achieve similar TFTs and circuits involving the indium oxide-based TFTs and circuits. For instance, rigid substrates other than glass substrate such as silica glass, quartz, silicon wafer, metallic plates with a dielectric coating may be adopted. For flexible substrates, in addition to PET, plastic substrates such as polyethylene naphthalate (PEN) sheets, polycarbonate (PC), polyethersulfone (PES) polyimide (PI) etc., as long as they are smooth and with a glass transition temperature sufficiently high to withstand the processing conditions of about 90° C. or above may be adopted. Therefore, the present invention should not be limited by the example process flows described below.

To form a two dimensional array using the simplified TFT (60), the first gate electrodes (52) of all TFTs in one row are connected electrically together to form a gate line. This gate line may be of the same conductor materials as the first gate electrode or may be another metal layer deposited on said thin substrate dielectric layer (51a) or directly on said first substrate (51). The electrical connection of the gate line associated with one row of TFTs to external circuits may be achieved by opening a window, which is not shown in FIG. 7 for simplicity, through the first interlayer dielectric layer (57), and depositing a first gate contact electrode in this window. In the two dimensional array, the first (source) electrodes (55) of all TFTs in one column are connected electrically together to form a data line for supplying data in the form of voltages or currents. Hence, it becomes clear that a portion of the first output electrode (55a) is to serve as the data line. This data line may be of the same conductor materials as the first output electrode (55a) or may be another metal layer and preferably deposited on said first interlayer dielectric layer (57).

Similar to the case of the TFT (50) as shown in FIG. 6, a second gate electrode (52b) may be deposited in the simplified TFTs (60) (see FIG. 7) in order to improve the modulation of the indium oxide-based channel layer (54). As mentioned before, this second gate electrode (52b) is optional. In order to improve adhesion of the second gate electrode (52b), a second adhesion layer (52c) made be deposited. Between the second gate electrode (52b) and the indium oxide-based channel layer (54), there is a second gate insulating layer (53a), said second gate insulating layer (53a) being selected from a group comprising: silicon oxide, silicon nitride, oxynitride and their combinations. Thickness of the second gate insulating layer (53a) is selected to be substantially the same as the first gate insulating layer (53). With the addition of the second gate electrodes, the TFTs may be turned OFF or ON more effectively.

Main Fabrication Steps for Indium Oxide-Based TFTs and Circuits (Top Gate):

On a first substrate (90) which may be a rigid glass substrate or a flexible plastic substrate (such as PET, PEN etc.) as shown in FIG. 10-a, a first light shield (91) is vacuum deposited and patterned using conventional lithography and etching methods. As mentioned before, the thickness of the first light shield (91) should be large enough so that ultra-violet or visible light is not allowed to transmit to affect the indium oxide-based channel layer to be deposited. The preferred thickness of the first light shield (91) is from 0.1 μm to 1 μm and is selected from a materials group comprising: Al, Cu, Ni, Ti, Ta, W, Cr, Mo, alloys and their combinations. Other materials may also be used as long as they can prevent ultra-violet and visible light from reaching the indium oxide-based channel layer. For X-ray application, it is preferable to select materials for the first light shield (91) to be non-transmissive to X-ray. For this purpose the materials with large atomic numbers will be preferable. After the patterning of the first light shield (91), a cleaning process is carried out and the first substrate (90) is baked at 90° C. for about 10 minutes. Due to the low glass transition temperatures, deformation often occurs to the plastic sheets during vacuum evaporation of the metallic layers as a result of rise in temperatures. In order to avoid this deformation, it is required to minimize the heat radiation from the evaporation source or the deposition power. In the case of vacuum evaporation using a resistively heated source, a radiation shield may be adopted to prevent un-wanted heat from reaching the plastic substrates during the thin film deposition.

A thin substrate dielectric layer (92) such as silicon oxide, silicon dioxide, silicon nitride or oxynitride is then deposited by PECVD or vacuum deposition over the entire top surface of the first substrate (90) to a thickness from 0.1 to 1 µm. The purposes of this thin substrate dielectric layer (92) are: [1] to obtain an electrical isolation between the first light shield (91) and the indium oxide-based channel layer (96, FIG. 10(b)) and [2] to prevent unwanted elemental inter-diffusion between the first substrate (90) and the indium oxide-based channel layer (96) during subsequent fabrication steps or during TFT/circuit operation. After this, a first (source) electrode (93) and a second (drain) electrode (94) are deposited preferably by a vacuum deposition method. The first (source) electrode (93) and the second (drain) electrode (94) may preferably consist of two sub-layers or may be a single layer. The second (drain) electrode (94) extends over the left-hand portion of the first substrate (90) to form a pixel electrode (95). Materials for the first (source) electrode (93), the second (drain) electrode (94) and the pixel electrode (95) may be Al, Al—Nd, Cu, conducting ITO, doped-ZnO or alloys. For LCD applications, it is preferable to adopt a transparent and conducting layer as the pixel electrode, such as ITO or ZnO (sheet resistance about 10 ohms/square). The ITO is deposited by DC or RF magnetron sputtering in an argon atmosphere at a pressure of 5 mtorr to 40 mtorr and a deposition power density in a range from 0.5 W/cm$^2$ to 5 W/cm$^2$, to a thickness of 0.2 µm. During the deposition, a first substrate heating may be applied to raise temperatures of the first substrate (90) in order to improve crystallinity and mobility of charge carriers. However, the temperatures applied should not be too high to cause deformation or decomposition of the first substrate (90). It should be mentioned that in addition to the DC or RF magnetron sputtering methods described above, the ITO or ZnO may be deposited by vacuum evaporation, chemical vapor deposition, chemical bath deposition, etc. as long as these methods can yield ITO or ZnO films with low enough sheet resistance. During the above deposition, it may be preferable to applied a substrate heating to a temperature not too high to affect the substrates used (especially for the case of plastic substrates) but sufficient for the creation of ITO or ZnO film with improved crystallinity and charge carrier mobilities.

It is noted that the first (source) electrode (93) must be separated electrically from the second (drain) electrode (94), which is achieved by an etching or lift-off process. After cleaning and baking, a first contact layer (93a) and a second contact layer (94a) are deposited by vacuum deposition and pattering processes. The purposes of the first contact layer (93a) and the second contact layer (94a) are: [1] to reduce the contact resistances between the first (source) electrode (93) and indium oxide-based channel layer (96) and between the second (drain) electrode (94) and indium oxide-based channel layer (96), [2] to prevent unwanted elemental inter-diffusion between the first (source) electrode (93), the second (drain) electrode (94) and indium oxide-based channel layer (96) in subsequent fabrication processes or during the TFT or circuit operation. The first contact layer (93a) and the second contact layer (94a) may be materials selected from a group comprising: Ti, W, Mo, Cr, Ni, alloys or suicides or their combinations and these are preferably deposited by vacuum deposition methods with patterning processes.

An indium oxide-based channel layer (96) is now deposited and patterned (see FIG. 10-b) so that it overlaps at least a portion of the first contact layer (93a) and the second contact layer (94a). In this example, pure indium oxide is deposited by RF magnetron sputtering in a mixture of argon (Ar) and O$_2$ (0.01–40%) at a pressure of 5–40 mtorr. The RF power is set at 1 W/cm$^2$ for a deposition time period of 3 hours. The thickness of the indium oxide-based channel layer obtained is about 100 nm. The exact thickness of the indium oxide-based channel layer (96) is selected by considering the leakage current and the carrier mobility. For thin films deposited on a substrate, the carrier mobility increases with the increase in thickness within a range due to the decrease in scattering effects. However, the dark resistance between the drain and source decreases as the film thickness increases. Hence, the dark leakage current between the drain and source increases with the increase on thickness. According to the present invention, the thickness of the indium oxide-based channel layer (96) is in a range of 50 nm to 400 nm. The thickness is controlled by controlling the deposition time and rate. It should be mentioned that in addition to the RF magnetron sputtering method described above, the indium oxide-based channel layer (96) may be deposited by DC sputtering, vacuum evaporation, chemical vapor deposition, chemical bath deposition, pyrolysis etc. as long as these methods can yield indium oxide-based channel layer with high enough sheet resistance. During the above deposition, it may be preferable to apply a substrate heating to a temperature not too high to affect the substrates used (especially for the case of plastic substrates) but sufficient for the creation of the indium oxide-based channel layer with improved crystallinity and charge carrier mobilities.

In this example, pure indium oxide is deposited by RF magnetron sputtering in a mixture of Ar and O$_2$ having a concentration in a range from 0.01 to 40% at a pressure of 20 mtorr as the indium oxide-based channel layer (96). The exact concentration value of O$_2$ is determined by the substrate temperature, total pressure in the sputtering chamber and the deposition rate. The RF power is set at 1 W/cm$^2$ for a deposition time period of 3 hours. The thickness of the indium oxide-based channel layer obtained is about 100 nm. It is noted that the content of oxygen is dependent on the conditions used. When deposited on substrates without intentional heating, a mixture of Ar and 0.1% O$_2$ may be used. When deposited on substrates heated at 100–150° C., a mixture of Ar and 25% O$_2$ may be employed. It should also be mentioned that the resistivity of the indium oxide-based channel layer (96) is controlled by regulating the deposition rate, substrate temperature and oxygen partial pressure.

During the deposition, a substrate heating may be applied in order to improve crystallinity and mobility of charge carriers of the indium oxide-based channel layer. However, the temperatures applied should not be too high to cause deformation of the first substrate (90) or to cause severe inter-diffusion between the thin substrate dielectric layer (92) and the indium oxide-based channel layer (96). It should be noted that, according to this invention, materials other than the pure In$_2$O$_3$ may be used. These materials include alloys of In$_2$O$_3$+Sn$_2$O$_3$, In$_2$O$_3$+Ga$_2$O$_3$ and alloys of In$_2$O$_3$+ZnO, which may be generally represented as [In$_x$Sn$_{(1-x)}$]$_2$O$_3$, [In$_x$Ga$_{(1-x)}$]$_2$O$_3$ and [In$_2$O$_3$]$_x$ [ZnO]$_{1-x}$. Here, x represents the content of indium (In) in the alloys and may be selected in a range of $0 \leq x \leq 1$. The patterning of the indium oxide-based channel layer (96) may be achieved by dry etching and preferably by lift-off. At this stage, a short heat treatment may be carried out in an environment containing oxygen at a temperature below 400° C. when a glass substrate is used and preferably below 200° C. when a plastic substrate is adopted. It is noted that this heat treatment is an optional step and may be eliminated if the charge carrier mobility of the as-deposited indium oxide-based channel layer (96) is high enough for TFT and circuit applications.

After the deposition and/or heat treatment, as shown in FIG. 10-c, a first gate insulator layer (97) is deposited by PECVD or sputtering methods to a thickness of about 100–200 nm and patterned to expose the main part of the pixel electrode (95). The materials for the first gate insulator layer may be selected from a group comprising: $SiO_2$, $Si_3N_4$, $Al_2O_3$ or mixtures of them. Alternately, certain oxides with large dielectric constants may also be used, such as $Ta_2O_5$, BaTiO and BaSrTiO, etc. A first gate layer (98) is now deposited and patterned on the first gate insulator layer (97) and to cover the entire indium oxide-based channel layer (96). The first gate layer (98) could be a material selected from a group comprising: Al, Cu, Ti, Mo, W, Cr or alloys and the thickness is from 100 nm to 1,000 nm. The thickness is selected so that the sheet resistance of the first gate layer (98) is sufficiently low and optically opaque. In this manner, the series resistance of the first gate layer (98) will be low enough and the first gate layer (98) may serve as the second light shield for the indium oxide-based TFT in order to prevent light from illuminating the indium oxide-based channel layer (96). Hence, it becomes clear that the first gate layer (98) which is deposited over the indium oxide-based channel layer also serves as a second light shield for the TFT in this example. Furthermore, the first gate insulator layer (98) may be formed by an anodization method which will be described in the subsequent part of the invention. However for X-ray application, it is preferable to select materials for the first light shield to be non-transmissive to X-rays. Therefore, it may be required to have a separate second light shield for this purpose.

As shown in FIGS. 10-c and 10-d, the fabrication is continued by depositing and patterning a first interlayer dielectric layer (99). The materials for the first interlayer dielectric layer (99) may be selected from a group comprising: $SiO_2$, $Si_3O_4$, $Al_2O_3$ or mixtures of them. The preferred thickness of the first interlayer dielectric layer (99) is from 500 nm to 2,000 nm. Lithography and etching processes are now carried out to open a first (source) contact window (100) and a second (gate) contact window (101) and to open the main area of the pixel electrode (95). After the opening of the two contact windows (100, 101) and the pixel electrode area, a layer of metal is deposited and patterned to form a data line (102) and a gate line (103) as shown in FIG. 10-e. An optional step may finally be performed to deposit and pattern a second interlayer dielectric layer, which is evident to those skilled in the arts and not shown in FIG. 10-e, for further protection of the TFT devices and circuits.

For certain applications such as LCD displays, it may be advantageous to bring the level of the pixel electrode (95) to be close to or above the level of gate line (103) and data line (102) so that a maximum electric field can be induced in a space (105) between the pixel electrode (95) and a top electrode (104 in FIG. 10e). This top electrode (104) is a glass substrate or a plastic substrate with a layer of transparent and conducting layer (104a). To achieve this elevated level, the first gate insulator layer (97) and the first interlayer dielectric layer (99) are retained in the region for the pixel electrode (95) as shown in FIG. 10-f, and an optional second interlayer dielectric layer (106) is deposited and patterned. The pixel electrode (95) is now deposited on the second interlayer dielectric layer (106) or directly on the first interlayer dielectric layer (99). After opening of a window for contact to the second (drain) electrode (94), a pixel electrode layer (95) with a contact portion (95a) which is contacting electrically the second (drain) electrode (94) is deposited and patterned. It is noted that the material for the contact portion (95a) may be different from the one for pixel electrode. In this manner, the pixel electrode level is close to or above that of the gate line (103) and data line (102) so that maximum electrical field may be induced in the region of the pixel electrode (95).

It is noted that to form a two dimensional array, all of the first (source) electrodes (93) of all TFTs in one column are connected electrically together after the electrode deposition and patterning as shown in FIG. 10-a, to form a data line for supplying data in the form of voltages or currents. Whereas, the first gate electrodes (98) of all TFTs in one row are connected electrically together to form a gate line. This gate line connection may be achieved through said gate line (103).

Main Fabrication Steps for Indium Oxide-Based TFTs and Circuits (Bottom Gate):

In the following, a brief description of process steps for the fabrication of TFTs and circuits with a bottom gate structure is provided. On a first substrate (110) which may be a glass substrate or a flexible plastic substrate (such as PET, PEN etc.) as shown in FIG. 11-a, a first light shield (111) is vacuum deposited and patterned using conventional lithography and etching methods. As mentioned before, the thickness of the first light shield should be large enough so that ultra-violet or visible light is not allowed to transmit through it to affect the indium oxide-based channel layer to be deposited. The preferred thickness is from 0.1 μm to 1 μm and the materials for the first light shield may be selected from a group comprising: Al, Cu, Ni, Ti, Ta, W, Cr, Mo and alloys. Other materials may well be used as long as they can prevent ultra-violet and visible light from reaching the indium oxide-based channel layer. After the patterning of the first light shield (111), a cleaning process is carried out and the first substrate is baked at 90° C. for about 10 minutes.

As mentioned before, due to the low glass transition temperatures, deformation often occurs to the plastic sheets during vacuum evaporation of the metallic layers as a result of a rise in temperatures. In order to avoid this deformation, it is required to minimize the heat radiation from the evaporation source or the deposition power. In the case of vacuum evaporation using a resistively heated source, a radiation shield may be adopted to prevent the un-wanted heat from reaching the plastic substrates.

A thin substrate dielectric layer (112) such as silicon oxide, silicon dioxide, silicon nitride or oxynitride is then deposited by PECVD or vacuum deposition over the entire first substrate to a thickness from 0.1 to 1 μm. The purposes of this thin substrate dielectric layer are: [1] to obtain an electrical isolation between the first light shield (111) and the first gate electrode (113, FIG. 11-b) and [2] to prevent unwanted elemental inter-diffusion between the first substrate (110) and TFT with the indium oxide-based channel layer (117). After this a first gate layer (113) is deposited and patterned on the thin substrate dielectric layer (112). The first gate layer (113) could be a material selected from a group comprising: Al, Cu, Ti, Mo, W, Cr, alloys and their combinations and the thickness is from 100 nm to 1,000 nm. The thickness is selected so that the sheet resistance of the first gate layer is sufficiently low and optically opaque. In this manner, the series resistance of the first gate layer will be low enough and the first gate layer may serve part of the function as the first light shield for the present indium oxide-based TFT. After the formation of the first gate layer (113), as shown in FIG. 10-a, a first gate insulator layer (114)

is deposited by PECVD, sputtering methods or anodization methods to a thickness of about 100 nm–200 nm. A patterning step, which is optional, is performed to remove the first gate insulator layer in surrounding regions. However, in many TFT and circuits applications, this optional patterning step may not be required except for contact window opening. The materials for the first gate insulator layer may be selected from a group comprising: $SiO_2$, $Si_3N_4$, $Al_2O_3$, $Ta_2O_5$ or mixture of them. Alternately, certain oxides with large dielectric constants may also be used, such as $Ta_2O_5$, BaTiO and BaSrTiO etc.

To fabricate TFTs and circuits, is it beneficial to deposit the gate insulating layers using methods without requiring elevated deposition temperatures, in order to minimize formation of defects during the heating or cooling (resulting from differences in thermal expansion coefficients) and to avoid deformation of the substrates. Hence, according to this invention, an anodization method may be advantageously used to prepare the gate insulating layers for the present indium oxide-based TFTs and circuits.

Take aluminum (Al) as an example for the gate layer in the indium oxide-based TFTs, an aluminum oxide layer may be formed at room temperature and this may be used as a gate insulator. To carry out the anodization, a substrate with the vacuum deposited and lithography patterned Al layer is immersed in an electrolyte with a voltage applied, to initiate a current and form a layer of anodic oxide on the surface of the Al layer. It is noted that during the anodization, Al acts as the anode whereas another metal (Pt) forms the cathode. The anodization electrolyte is a solution of ethylene glycol ($HOCH_2CH_2OH$, 100 gm) in DI water (75 gm) mixed with the tartaric acid ($HOOC(CHOH)_2COOH$, 2.5 gm) at a pH~7, by adding ammonia hydroxide.

In the initial phase of the anodization, a constant electrical current is maintained by progressively increasing the bias voltage. After a predetermined voltage (100–150 V) has been reached, the voltage is kept constant while the current is allowed to decrease until the anodization reaction is completed (total time period about 120 minutes). It should be mentioned that the thickness of the anodized $Al_2O_3$ film is control by the duration of the anodization with constant current density or the terminal voltage for the constant density deposition. For a terminal voltage of 100 volts using the above electrolyte, the thickness of the $Al_2O_3$ is about 150 nm. After the above described the substrate with the $Al_2O_3$ film is removed from the electrolytic bath and immersed into a beaker containing ethylene glycol for a few minutes. This is followed by a final rinse in deionized water. In order to minimize further the leakage current through the anodized $Al_2O_3$, a subsequent heat treatment may be carried out in nitrogen. The breakdown electric field of the $Al_2O_3$ films obtained can be as high as 8 MV/cm and these are suitable for gate insulators in the present TFTs with indium oxide-based channel layers.

After this, a first (source) electrode (15) and a second (drain) electrode (116) are deposited preferably by a vacuum deposition method and patterned so that the first (source) electrode overlaps a portion of said first gate layer (113) whereas the second (drain) electrode overlaps another portion of the first gate layer (see FIG. 11-b). Materials for the first (source) electrode (115) and the second (drain) electrode (116) may be selected from a group comprising: Al, Al—Nd, Cu, ITO, doped-ZnO, alloys or their combination. A first contact layer (15a) and the second contact layer (116a) may preferably be deposited over at least a portion of said first (source) electrode (115) and second (drain) electrode (116) and patterned. The purposes of the first contact layer (115a) and the second contact layer (116a) are: [1] to reduce the contact resistances between the first (source) electrode and indium oxide-based channel layer and between the second (drain) electrode and indium oxide-based channel layer, [2] to prevent unwanted elemental inter-diffusion between the first (source) electrode, the second (drain) electrode and indium oxide-based channel layer in subsequent fabrication processes or during the operation. The first contact layer (115a) and the second contact layer (116a) may be materials selected from a group comprising: Ti, W, Mo, Cr, Ni, alloys or silicides and these are deposited by vacuum deposition methods with patterning processes.

For certain applications, it may be advantageous to adopt a transparent and conducting layer such as ITO or ZnO (sheet resistance about 10 ohms/square) as the first (source) electrode (115) and the second (drain) electrode (116). When ITO is adopted, it is deposited by DC or RF magnetron sputtering in an Ar atmosphere at a pressure of 5 mtorr to 40 mtorr and a DC or RF sputtering power density in a range from 0.5 $W/cm^2$ to 5 $W/cm^2$, to a thickness of 0.2 μm and with a sheet resistivity of about 10 ohms/square. During the deposition, a substrate heating may be applied at temperatures in order to improve crystallinity and mobility of charge carriers. However, the temperatures applied should not be too high to cause deformation of the first substrate (110). It should be mentioned that in addition to the DC or RF magnetron sputtering methods described above, the ITO or ZnO films may be deposited by vacuum evaporation, chemical vapor deposition, chemical bath deposition, etc. as long as these methods can yield ITO or ZnO films with low enough sheet resistance. During the above deposition, it may be preferable to applied a substrate heating to a temperature not too high to affect the substrates used (especially for the case of plastic substrates) but sufficient for the creation of ITO or ZnO film with improved crystallinity and charge carrier mobilities.

It is noted that the first electrode (115) must be separated electrically from the second electrode (116), which is achieved by an etching or lift-off process. After cleaning and baking, a first contact layer (115a) and a second contact layer (116a) are deposited by vacuum deposition and pattering processes.

The indium oxide-based channel layer (117) is deposited and patterned (see FIG. 11-b) in such a way that it overlaps at least a portion of the first contact layer (115a) and the second contact layer (116a), or at least a portion of the first (source) electrode (115) and the second (drain) electrode (116) in the event when said first contact layer (115a) and second contact layer (116a) are not adopted in the present TFT structure. In this example, pure indium oxide is deposited by RF magnetron sputtering in a mixture of Ar and $O_2$ having a concentration in a range from 0.01 to 50% at a pressure of 5–40 mtorr as the indium oxide-based channel layer (117). The exact concentration value of $O_2$ is determined by the substrate temperature, total pressure in the sputtering chamber and the deposition rate. The RF power is set at 1 $W/cm^2$ for a deposition time period of 3 hours. The thickness of the indium oxide-based channel layer obtained is about 100 nm. During the deposition, a substrate heating may be applied in order to improve crystallinity and mobility of charge carriers of the indium oxide-based channel layer. However, the temperatures applied should not be too high to cause deformation of the first substrate (110) or to cause severe inter-diffusion between the thin substrate dielectric layer (112) and the TFT with indium oxide-based channel layer (117). It should be noted that, according to this invention, materials other than the pure $In_2O_3$ may be used in the TFTs and circuits with a bottom gate configuration. These materials include alloys of $In_2O_3+Sn_2O_3$, $In_2O_3+Ga_2O_3$ and alloys of $In_2O_3+ZnO$, which may be generally represented as $[In_xSn_{(1-x)}]_2O_3$ and $[In_xGa_{(1-x)}]_2O_3$ $[In_2O_3]_x$ $[ZnO]_{(1-x)}$. Here x represents the content of In in the alloys and may be selected in a range $0 \leq x \leq 1$. The patterning of the indium oxide-based channel layer may be achieved by dry etching and preferably by lift-off. At this stage, an optional short heat treatment may be carried out in an environment containing oxygen at a temperature below 400° C. when a glass substrate is used and preferably below 200° C. when a plastic substrate is adopted. It is noted that this heat treatment is an optional step and may be eliminated if the charge carrier mobility of the as-deposited indium oxide-based channel layer is high enough for TFT and circuit applications. It is noted that the content of oxygen is dependent on the conditions used. When deposited on substrates without intentional heating, a mixture of Ar and 0.1% $O_2$ may be used. When deposited on substrates heated at 100–150° C., a mixture of Ar and 25% $O_2$ may be employed. It should also be mentioned that the resistivity of the indium oxide-based channel layer is controlled by regulating the deposition rate, substrate temperature and oxygen partial pressure.

It should be mentioned that in addition to the RF magnetron sputtering method described above, the indium oxide-based channel layer (117) may be deposited by DC sputtering, vacuum evaporation, chemical vapor deposition, chemical bath deposition, etc. as long as these methods can yield indium oxide-based channel layer with high enough sheet resistance. During the above deposition, it may be preferable to applied a substrate heating to a temperature not too high to affect the substrates used (especially for the case of plastic substrates) but sufficient for the creation of the indium oxide-based channel layer with improved crystallinity and charge carrier mobilities.

As shown in FIG. 11-c, the fabrication is continued by depositing and pattering, a first interlayer dielectric layer (118). The materials for the first interlayer dielectric layer may be selected from a group comprising: $SiO_2$, $Si_3O_4$, polymers, polyimide or combinations of them. After this, a layer of metal is deposited and patterned to form a second light shield (119). The preferred thickness of the second light shield is from 0.1 μm to 1 μm and may be selected from a group of materials comprising: Al, Cu, Ni, Ti, Ta, W, Cr, Mo and alloys. Other materials may also be used as long as they can prevent ultra-violet and visible light from reaching the indium oxide-based channel layer.

As shown in FIG. 11-d, a step may now be performed to deposit and pattern a second interlayer dielectric layer (120) for further protection of the TFT devices and circuits. The materials for the second interlayer dielectric layer may be selected from a group comprising: $SiO_2$, $Si_3O_4$, polymers, polyimide or their combinations.

A lithography and etching method is now performed as shown in FIG. 11-e to open a first window (15b) through said second interlayer dielectric layer (120), first interlayer dielectric layer (118) to expose the first (source) electrode (115) and to open a second window (116b) through said second interlayer dielectric layer (120), first interlayer dielectric layer (118) to expose the second (drain) electrode (116). A third window, which is not shown in FIG. 11-e, is also etched through said second interlayer dielectric layer (120) and first interlayer dielectric layer (118) to expose the first gate layer (113) for electrical contact.

For LCD or OLED applications, it is preferable to adopt a transparent and conducting layer such as ITO or ZnO (sheet resistance about 10 ohms/square) as the first pixel electrode (121), as shown in FIG. 11-f. In the present example, the deposition of ITO first pixel electrode is carried out using a target with Sn:In ratio of 1:9 by RF magnetron sputtering in an Ar atmosphere at a pressure of 5 mtorr to 40 mtorr and a RF power density in a range from 0.5 W/cm² to 5 W/cm², to a thickness of 0.2 μm. During the deposition, a substrate heating may be applied at temperatures in order to improve crystallinity and mobility of charge carriers. Typical sheet resistance of the deposited pixel electrode is 10–20 ohm/square. However, the temperatures applied should not be too high to cause deformation of the first substrate (110). It is also noted that a pixel electrode portion (121a) of said pixel electrode (121) is deposited directly in the second window (116b) to make electrical contact with said second (drain) electrode (116). It is worthwhile to point out that said pixel electrode portion (121a) deposited in said second window (116b) may be a material which different from the materials for the pixel electrode (121) in order to reduce further the contact resistance with the second (drain) electrode (116).

To connect the present TFTs to external units or to form circuits, metal layers are deposited and patterned to form data lines (115c) and gate lines (113c), as shown in FIG. 11-g. Here, the gate line (113c) is connected electrically to the first gate layer (113).

It is noted that in the present TFTs and circuits with indium oxide-based channel layers, the pixel electrode (121) is deposited on the second interlayer dielectric layer (120) so that the level of the pixel electrode is very close to that of the gate line (113c) and data line (115c) so that maximum electrical field may be induced in the region of the pixel electrode (121). At this stage, an optional third interlayer dielectric layer, which is evident to those skilled in the arts and is not shown in FIG. 11-h, may be deposited and patterned to protect or passivate the TFTs and circuits.

The field effect mobility of charge carriers in the indium oxide-based channel layer fabricated at substrate temperatures of 100–150° C. can be as high as 20 cm² V-sec without a post deposition heat treatment. With a treatment at temperatures from 100–150° C. in air, charge carrier mobility values even higher than the above value can be obtained.

What is claimed is:

1. An indium tin oxide thin film transistor for forming a switching array or a circuit comprising:
   a first substrate;
   a first conductive gate layer;
   a first gate insulating layer overlapping at least a portion of said first conductive gate layer;
   a source electrode overlapping a first portion of said first gate insulating layer;
   a drain electrode overlapping a second portion of said first gate insulating layer; and
   an indium tin oxide channel layer overlapping a portion of said first gate insulating layer, overlapping at least a portion of said source electrode and at least a portion of said drain electrode.

2. An indium tin oxide thin film transistor for forming a switching array or a circuit as defined in claim 1, wherein said first substrate is selected from a group comprising: glass substrates, silica substrates, plastic sheets, metallic sheets with a dielectric coating, ceramic substrates and semiconductor substrates.

3. An indium oxide-based thin film transistor for forming a switching array or a circuit as defined in claim 1, wherein material of said indium oxide-based channel layer is selected from a group comprising: indium tin oxide, indium gallium oxide and their alloys.

4. An indium tin oxide thin film transistor for forming a switching array or a circuit as defined in claim 1 further comprising at least a first interlayer dielectric layer, said first interlayer dielectric layer overlaps at least a portion of said indium tin oxide channel layer, a portion of said source electrode and a portion of said drain electrode for electrical isolation and passivation.

5. An indium tin oxide thin film transistor for forming a switching array or a circuit as defined in claim 1, further comprising a thin substrate dielectric layer, said thin substrate dielectric layer being introduced between said indium tin oxide channel layer and said first substrate, to minimize elemental inter-diffusion between said indium tin oxide channel layer and said first substrate.

6. An indium tin oxide thin film transistor for forming a switching array or a circuit as defined in claim 1, further comprising a first light shield layer deposited below said indium tin oxide channel layer and a second light shield layer deposited above said indium tin oxide channel layer, said first light shield and second light shield being selected from a group of materials: Al, Cu, Ni, Ti, Ta, W, Cr, Mo, alloys and combinations, said first light shield and second light shield are substantially non-transmissive to ultra-violet light and visible light and are deposited to minimize generations of electron hole pairs due to illumination of said indium tin oxide channel layer.

7. An indium tin oxide thin film transistor for forming a switching array or a circuit as defined in claim 1, further comprising a first contact layer between said source electrode and said indium tin oxide channel layer to minimize contact resistance of said source electrode, and a second contact layer between said drain electrode and said indium tin oxide channel layer to minimize contact resistance of said drain electrode.

8. An indium tin oxide thin film transistor for forming a switching array or a circuit as defined in claim 1, further comprising a second gate insulating layer and a second conductive gate layer to facilitate modulation of electrical conduction of said indium tin oxide channel layer.

9. An indium tin oxide thin film transistor for forming a switching array or a circuit as defined in claim 1, further comprising a second substrate having a top electrode, said second substrate being installed on said first substrate to enclose and protect said switching array or said circuit and light emitting elements or light switching elements.

10. An indium tin oxide thin film transistor for forming a switching array or a circuit as defined in claim 1, wherein said first conductive gate layer overlaps at least a portion of said first gate insulating layer, a portion of said source electrode and a portion of said drain electrode, said first gate insulating layer overlaps at least a portion of said indium tin oxide channel layer, forming a top-gate thin film transistor structure having an indium tin oxide channel layer.

11. An indium tin oxide thin film transistor for forming a switching array or a circuit as defined in claim 1, wherein said indium tin oxide channel layer is deposited on said first gate insulating layer, said first gate insulating layer overlaps at least a portion of said first conductive gate layer, a portion of said source electrode and a portion of said drain electrode, forming a bottom-gate thin film transistor structure having an indium tin oxide channel layer.

12. An indium tin oxide thin film transistor for forming a switching array or a circuit as defined in claim 1, further comprising a pixel electrode, said pixel electrode forming a part of a light switching or receiving element and being connected electrically to said drain electrode and is selected from a material group comprising: indium tin oxide, indium oxide, zinc oxide and their alloys.

13. An indium tin oxide thin film transistor for forming a switching array or a circuit as defined in claim 1, further comprising a data line and a gate line, said data line being connected electrically to drain electrodes of a plurality of said indium tin oxide thin film transistors whereas said gate line being connected electrically to gate electrodes of said indium tin oxide thin film transistors for control and addressing of light switching and receiving elements connected to said drain electrodes.

* * * * *